United States Patent
Swanson

(10) Patent No.: US 6,452,519 B1
(45) Date of Patent: *Sep. 17, 2002

(54) ANALOG TO DIGITAL CONVERTER UTILIZING A HIGHLY STABLE RESISTOR STRING

(75) Inventor: Eric J. Swanson, Buda, TX (US)

(73) Assignee: Silicon Laboratories, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/432,502

(22) Filed: Nov. 2, 1999

Related U.S. Application Data

(63) Continuation of application No. 09/429,001, filed on Oct. 29, 1999, now Pat. No. 6,369,720.
(60) Provisional application No. 60/161,099, filed on Oct. 22, 1999.

(51) Int. Cl.[7] ............................................... H03M 1/10
(52) U.S. Cl. ...................................... 341/120; 341/155
(58) Field of Search ................................ 341/172, 155, 341/118, 120, 144; 330/307, 347

(56) References Cited

U.S. PATENT DOCUMENTS

| | | | |
|---|---|---|---|
| 3,187,323 A | 6/1965 | Flood et al. | 340/347 |
| 4,016,557 A | 4/1977 | Zitelli et al. | 340/347 |
| 4,070,709 A | 1/1978 | Roberts et al. | 364/602 |
| 4,077,035 A | 2/1978 | Yee | 340/347 |
| 4,129,863 A | 12/1978 | Gray et al. | 340/347 |
| 4,129,864 A | 12/1978 | Carpenter et al. | 340/347 |
| 4,200,863 A | 4/1980 | Hodges et al. | 340/347 |
| 4,385,286 A * | 5/1983 | Haque | 340/347 |
| 4,455,676 A | 6/1984 | Kaneda | 381/106 |
| 4,542,304 A | 9/1985 | Swanson | 307/353 |
| 4,559,523 A | 12/1985 | Wakita | 340/347 |
| 4,570,080 A | 2/1986 | Swanson | 307/353 |
| 4,585,956 A | 4/1986 | Lie | 307/353 |
| 4,611,342 A | 9/1986 | Miller et al. | 381/36 |
| 4,616,210 A | 10/1986 | Ferber et al. | 340/347 |
| 4,628,279 A | 12/1986 | Nelson | 330/257 |
| 4,709,225 A | 11/1987 | Welland et al. | 340/347 |
| 4,733,217 A | 3/1988 | Dingwall | 340/347 |
| 4,748,418 A | 5/1988 | Kerth | 330/9 |
| 4,815,118 A | 3/1989 | Acharya et al. | 378/19 |
| 4,939,516 A | 7/1990 | Early | 341/143 |
| 4,943,807 A | 7/1990 | Early et al. | 341/120 |
| 5,006,853 A | 4/1991 | Kiraki et al. | 341/156 |
| 5,039,989 A | 8/1991 | Welland et al. | 341/143 |
| 5,053,771 A | 10/1991 | McDermott | 341/156 |
| 5,075,633 A | 12/1991 | Bowers | 330/69 |
| 5,134,401 A | 7/1992 | McCartney et al. | 341/143 |
| 5,155,431 A | 10/1992 | Holcomb | 324/121 |
| 5,157,395 A | 10/1992 | Del Signore et al. | 341/143 |

(List continued on next page.)

OTHER PUBLICATIONS

Allen and Holberg, *CMOS Analog Circuit Design*, Oxford University Press, (pp. 490–497; 529–544) 1987.

(List continued on next page.)

*Primary Examiner*—Peguy Jeanpierre
(74) *Attorney, Agent, or Firm*—O'Keefe, Egan & Peterman, LLP

(57) ABSTRACT

A successive approximation ADC is provided. Contacts to a resistor string may be placed outside of the current path of the resistor string to provide a highly stable resistor string having a very low temperature drift. The resistor string may be utilized to calibrate a successive approximation ADC. The resistor string may also be a portion of a resistor array of a resistor and capacitor array ADC. The resistor string may be calibrated with a calibration ADC having a resolution greater than the resistor string. The calibration ADC may be a delta sigma ADC.

52 Claims, 24 Drawing Sheets

U.S. PATENT DOCUMENTS

| | | | |
|---|---|---|---|
| 5,177,453 A | | 1/1993 | Russell et al. ............... 330/284 |
| 5,194,865 A | | 3/1993 | Mason et al. ............... 341/132 |
| 5,220,589 A | | 6/1993 | Gard ........................... 378/19 |
| 5,233,309 A | * | 8/1993 | Spitalny et al. ............... 330/84 |
| 5,247,210 A | | 9/1993 | Swanson .................... 307/355 |
| 5,268,651 A | | 12/1993 | Kerth ......................... 330/307 |
| 5,319,319 A | | 6/1994 | Kerth ......................... 330/295 |
| 5,446,371 A | | 8/1995 | Eccleston et al. ............ 324/121 |
| 5,471,208 A | * | 11/1995 | Sauer ......................... 341/120 |
| 5,541,600 A | | 7/1996 | Blumenkrantz et al. .... 341/139 |
| 5,600,317 A | | 2/1997 | Knoth et al. ................. 330/139 |
| 5,621,339 A | | 4/1997 | Kerth et al. ................... 327/65 |
| 5,668,551 A | | 9/1997 | Garavan et al. ............ 341/120 |
| 5,696,508 A | | 12/1997 | Gross, Jr. et al. ........... 341/118 |
| 5,714,956 A | | 2/1998 | Jahne et al. ................. 341/155 |
| 5,764,175 A | | 6/1998 | Pan ............................. 341/161 |
| 5,796,310 A | * | 8/1998 | Ariyosi et al. .............. 330/307 |
| 5,844,512 A | | 12/1998 | Gorin et al. ................. 341/139 |
| 5,892,472 A | | 4/1999 | Shu et al. .................... 341/139 |
| 6,144,331 A | * | 7/2000 | Jiang .......................... 341/172 |
| 6,204,785 B1 | * | 3/2001 | Fataruso et al. ............ 341/120 |
| 6,255,979 B1 | * | 7/2001 | Allee et al. ................. 341/159 |
| 6,288,664 B1 | * | 9/2001 | Swanson .................... 341/155 |
| 6,310,518 B1 | * | 10/2001 | Swanson .................... 330/282 |
| 6,309,740 B1 | * | 4/2002 | Swanson .................... 341/155 |

OTHER PUBLICATIONS

Ohri and Callahan, "Integrated PCM Codec," IEEE JSSC, vol. SC–14, No. 1, (pp. 38–46) Feb. 1979.

Tan, Kiriaki, De Wit, Fattaruso, Tsay, Matthews, and Hester, "Error Correction Techniques for High–Performance Differential A/D Converters," IEEE JSCC, vol. SC–25, No. 6(pp. 1318–1327) Dec. 1990.

Linear Technology Data Sheet LTC1100, "Precision, Chopper–Stabilized Instrumentation Amplifier" pp. 1–8 1994.

Fotouhi, Bahram, "High–Resolution Successive–Approximation Analog–to–Digital Conversion Techniques in MOS Integrated Circuits," Dissertation from The University of California, Berkeley, (pp. 86–95; 158–162) 1980.

Holloway, Peter, "A Trimless 16b Digital Potentiometer," IEEE, ISSCC Digest, (pp. 66–67; 320–321) Feb. 22, 1984.

Donald Kerth and Douglas Piasecki, "An Oversampling Converter for Strain Gauge Transducers," IEEE JSSC, vol. SC–27, No. 12 (pp. 1689–1696) Dec. 1992.

Hae–Seung ee and David Hodges, "A Self–Calibrating 15 Bit CMOS A/D Converter," IEEE JSSC, vol. SC–19, No. 6 (pp. 813–819) Dec. 1984.

Wait, Huelsman and Korn, *Introduction to Operational Amplifier Theory and Applications*, McGraw–Hill (pp. 31–40, 64), 1974.

Cirrus Logic, Inc., "16–Bit, 100 kHz/20 kHz A/D Converters CS5101A/CS5102A;" (pp. 1–46) Mar. 1995.

* cited by examiner

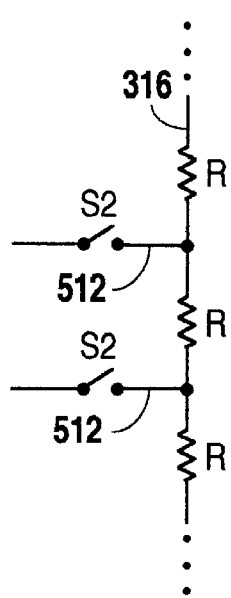
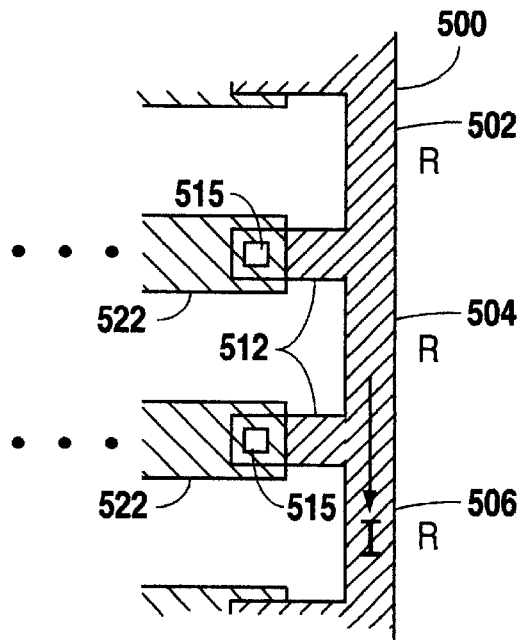
Fig. 5A
Fig. 5B
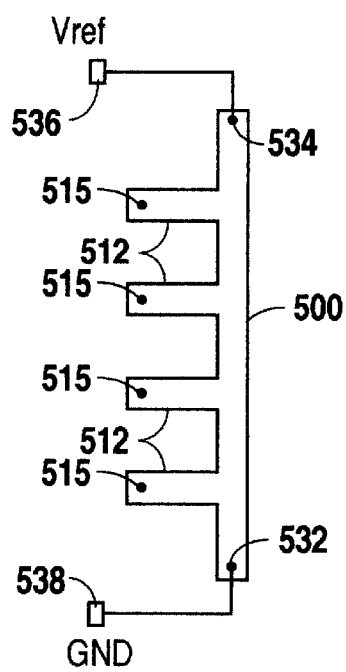
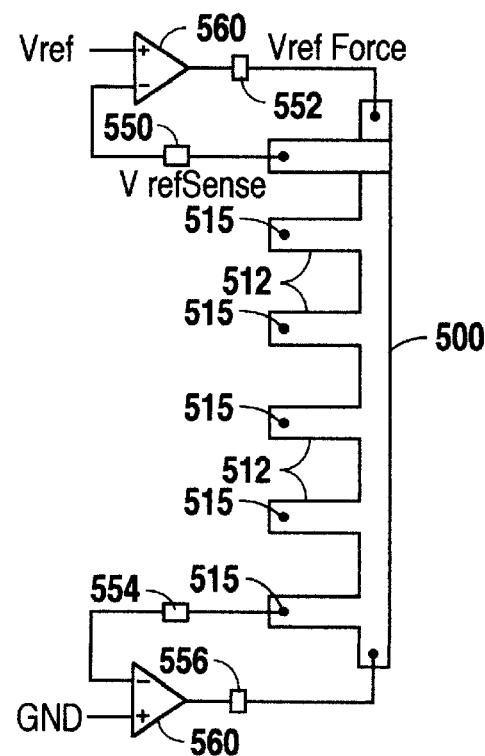
Fig. 5C
Fig. 5D

US 6,452,519 B1

ANALOG TO DIGITAL CONVERTER UTILIZING A HIGHLY STABLE RESISTOR STRING

This application claims priority to provisional application Ser. No. 60/161,099 filed on Oct. 22, 1999 entitled "Programmable Gain Preamplifier" by Eric J. Swanson and is continuation of U.S. Ser. No. 09/429,001 filed Oct. 29, 1999 now U.S. Pat. No. 6,369,740 issued Apr. 9, 2002 entitled "Programmable Gain Preamplifier Coupled To An Analog to Digital Converter by Eric J. Swanson.

TECHNICAL FIELD

This invention relates to analog to digital converters, and more particularly successive approximation converters that are coupled to a highly stable resistor string.

BACKGROUND

Preamplifiers are utilized for a variety of purposes. A common application for preamplifiers is to amplify low voltage level signals which are to be processed by circuitry that operates at higher voltage levels. For example, a preamplifier may be used to amplify a transducer output (a thermocouple output, strain gauge output, thermistor output, etc.) prior to processing the transducer output in other signal processing circuitry. Transducer signals often are amplified because most transducers produce only low voltage outputs while the other signal processing circuitry may operate at a significantly higher voltage range. For example, a thermocouple may provide an output signal having a range of 2.5 mV while an analog to digital converter (ADC) utilized to convert the thermocouple output into a digital signal may operate at a 2.5V full scale voltage. Therefore, a preamplifier may be utilized to amplify the transducer output prior to processing the output signal with the ADC. Because the signal processing circuitry (for example an ADC) may have a relatively high noise density, the use of a preamplifier reduces the signal processing circuit's output noise when that noise is input-referred to the preamplifier input (i.e., the noise at the signal processing circuitry output is divided by the gain). However, the use of a preamplifier typically has a dynamic range drawback since improved low end dynamic range is provided at the expense of high end dynamic range. It is thus desirable to provide a preamplifier configuration which avoids high end dynamic range loss.

The amount of amplification required to be provided by the preamplifier may vary depending upon the transducer output characteristics. Thus, a programmable preamplifier which may be programmed to different gain values is desirable so that a single preamplifier may be used with a variety of input voltage signals. For example, the preamplifier input may be switchably coupled to a plurality of different transducer inputs and each transducer may have a different output voltage characteristic. In such circumstances it is desirable to adjust the preamplifier gain depending upon the signal level presented at the preamplifier input.

Typical preamplifier configurations are comprised of operational amplifiers (opamp) and resistors. FIG. 1 illustrates a typical preamplifier configuration. As shown in FIG. 1, the preamplifier 1 is comprised of an opamp 3 and resistors R1–R4. By selectively closing one of the switches Sa, Sb, and Sc, the gain of the preamplifier may be programmably set. Ideally the closed switch would provide negligible resistance and the gain at the opamp output Vopamp/Vin would be independent of the switch resistance. However, because the switch is not ideal and adds some gain error due to its resistance, the preamplifier output may chosen at the nodes Vout1, Vout2 or Vout3 so that any error caused by the switch resistance is negated. Thus, it can be shown that for equal values for resistors R1–R4 if Sa is closed Vout1/Vin=2, if Sb is closed Vout2/Vin=3, and if Sc is closed Vout/Vin=4 (i.e., the gain equals X, where the number of resistors between Vout and the inverting input of the opamp is X=1).

Monolithic implementations of circuits such as that shown in FIG. 1 may have gain drifts with temperature in excess of 4 or 5 ppm (parts per million) per degree Celsius. The predominate mechanism producing such drift may be the drift of the gain setting resistor strings. One approach to minimize the effect of the drift of the resistor string is to remove from resistor string contacts from the resistor string current path. Such a technique is shown in U.S. Pat. No. 5,319,319 to Kerth, the disclosure of which is incorporated herein by reference. The preamplifier of U.S. Pat. No. 5,319,319 is not, however, easily adapted to provide a preamplifier configuration which avoids high end dynamic range loss as discussed above.

A variety of types of analog to digital converters ("ADCs") are commonly employed for converting analog input signals to a digital output. One type of ADC is a. successive approximation ADC. A switched capacitor array is one type of successive approximation ADC. Switched capacitor array ADCs are known in the art as shown in U.S. Pat. No. 4,129,863 to Gray et al., in U.S. Pat. No. 4,709,225 to Welland et al., in U.S. Pat. No. 5,006,853 to Kiriaki, and in Lee et al., "A Self-Calibrating 15 Bit CMOS AID Converter," IEEE JSSC, December. 1984, p. 813–819. Switched capacitor approaches generally provide good temperature drift and aging characteristics.

Another type of successive approximation ADC is a switched resistor capacitor array ADC. Switched resistor capacitor array ADCs are known in the art as shown in Fotouhi, "High-Resolution Successive Approximation Analog To Digital Conversion Techniques In MOS Integrated Circuits" Dissertation, University of California, 1980, p. 86–93. The switched resistor capacitor array ADC, however, suffers from inaccuracies in the resistor array, resistor temperature drift, and resistor aging drift, all of which may be substantial.

SUMMARY OF INVENTION

The present invention provides a solution to one or more of the disadvantages and deficiencies described above. In one broad respect, a programmable gain preamplifier is provided which has a low temperature drift and good dynamic range characteristics. The programmable gain preamplifier provides a programmable gain of the difference between two input signals (Ain and Ain' for example). One of the input signals (Ain') may be an estimation of the other input signal (Ain). The estimation input signal (or a signal related to the estimated input) may be generated by the use of a reference voltage and a first resistor string. More particularly, the reference voltage and the first resistor string may operate as a digital to analog converter (DAC) that converts a digital estimation signal to an analog estimation voltage. The analog estimation voltage operates as an analog voltage that is a function of (or the same as) the analog Ain' estimation signal. The first resistor string may provide the estimation voltage without loading the resistor string. Thus, the first resistor string may be simultaneously utilized by other circuitry, such as for example, a downstream ADC. The programmable preamplifier gain may be set by the use of a second resistor string and digitally programmable switches. Contacts to the resistors strings may be placed outside of the current path of each resistor string to provide highly stable resistor strings having a very low temperature drift. In one preamplifier embodiment, some or all of the opamps may chopper stabilized opamps, at least one opamp may be a current feedback opamp, the resistor strings may be at least 64 resistors long and programmable gains from 1 to 32 may be provided.

In another broad aspect, a programmable gain preamplifier is provided which has a low temperature drift and good dynamic range characteristics. The programmable gain preamplifier may be coupled to an analog to digital converter. The analog to digital converter may be a switched capacitor array analog to digital converter. The analog to digital converter may be a resistor array and capacitor array analog to digital converter. A resistor string having contacts out of the resistor string current path may be utilized with the programmable gain preamplifier or the analog to digital converter or both. The resistor string may be utilized to calibrate the analog to digital converter or the programmable gain preamplifier or both. The resistor string may also be utilized by the analog to digital converter when conversions are being performed. The programmable gain preamplifier provides a programmable gain of the difference between two input signals (Ain and Ain' for example). One of the input signals (Ain') may be an estimation of the other input signal (Ain).

The present invention also provides a solution to one or more of the disadvantages and deficiencies described above. In one broad respect, a successive approximation ADC utilizes an improved resistor string. Contacts to the resistor string may be placed outside of the current path of the resistor string to provide a highly stable resistor string having a very low temperature drift. The resistor string may be shared with other system circuitry, such as for example, a programmable gain preamplifier. The resistor string may be calibrated with a calibration ADC having a resolution greater than the resistor string. The calibration ADC may be a delta sigma ADC. The resistor string may be utilized to calibrate a successive approximation ADC.

BRIEF DESCRIPTION OF THE DRAWINGS

FIGS. 5A–5D illustrate a technique for providing contacts to the resistor strings of the programmable gain preamplifiers disclosed herein.

DETAILED DESCRIPTION OF THE INVENTION

Figure 2:
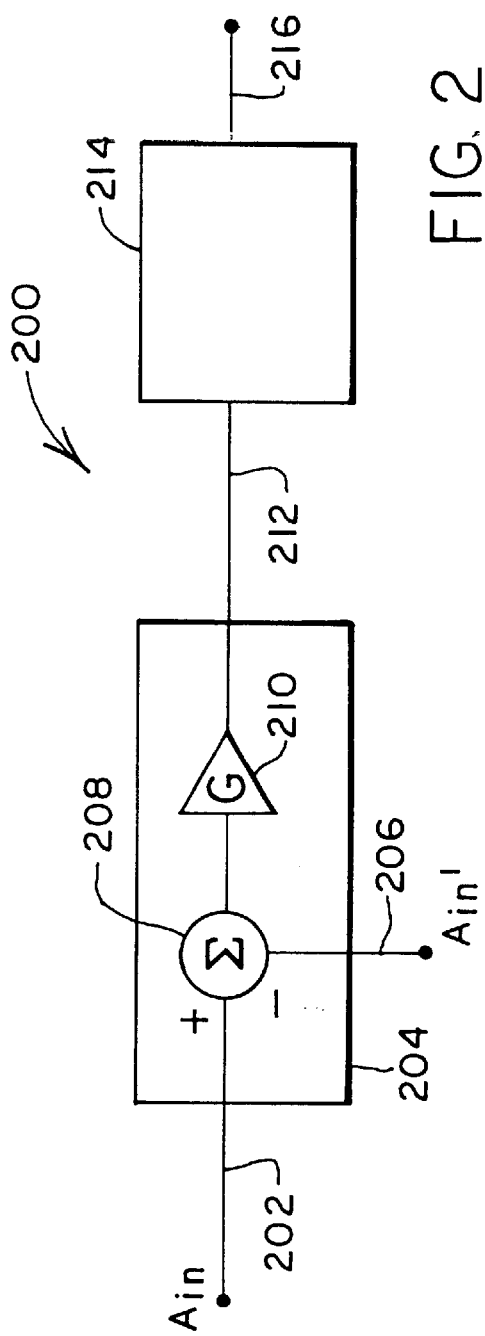
FIG. 2 is an exemplary system for utilizing the programmable gain preamplifier disclosed herein.

FIG. 2 illustrates an exemplary system for utilizing the programmable gain preamplifier techniques of the present invention. As shown in FIG. 2, a system 200 is provided for processing an input 202 through a programmable gain preamplifier block 204 which in turn provides an amplified signal 212 to a signal processing circuit 214 which has an output 216. In one embodiment, the system may be used for converting an analog input 202 (Ain) to a digital output 216 (Dout). Such a system may be utilized, for example, when converting an analog input signal of a transducer to a digital output signal. In such a system, the input 202 may be an analog signal provided from a transducer and the signal processing circuit 214 may be an ADC. The programmable gain preamplifier and the techniques for its use disclosed herein, however, are not limited to converting transducer inputs and it will be recognized that many other inputs may be utilized for the system 200. It will also be recognized that many types of ADCs may be utilized with the programmable gain preamplifier, including delta-sigma ADCs, flash ADCs, successive approximation ADCs, resistor-capacitor array ADCs, switched weighted capacitor ADCs etc. Further, the programmable gain preamplifier may be used with many other types of signal processing circuits in addition to ADCs.

As shown in FIG. 2, the programmable gain preamplifier may be conceptualized as a subtraction block 208 and a gain block 210. The subtraction block 208 subtracts the Ain' 206 input from the Ain 202 input. Thus the output of the entire preamplifier block is G(Ain—Ain'), where G is the gain of gain block 210. The Ain' 206 signal may be an estimation of the Ain 202 signal. As used herein an estimation signal may be a signal that is an actual estimation of another signal or may be a signal that has a known relationship to the actual estimation of another signal. The known relationship may be a mathematical function, may be the result of correlation tables, or may be the result of other mapping functions.

The Ain' 206 estimation signal may be generated by any of a variety of methods that provide an analog estimate (or some known function of the estimate) of the Ain 202 signal. For example if block 214 is an ADC, the digital output 216 may be reconverted back to an analog signal through the use of a digital to analog converter (DAC) to generate the Ain' 206 estimation signal. This technique may be particularly suitable for generating the Ain' 206 estimation signal if the analog input Ain 202 is not varying very fast. Alternatively, more advanced prediction methods such as statistical methods, linear prediction methods, etc. may be utilized. The most desirable method chosen for generating the estimated input signal Ain' 206 may be user application specific depending upon the nature and characteristics expected at the Ain 202 signal input. If the estimation of the Ain 202 signal is relatively accurate, subtracting the estimated signal will allow for increased gain in front of the ADC, and thus, result in an improved dynamic range at the ADC output.

Figure 2A:
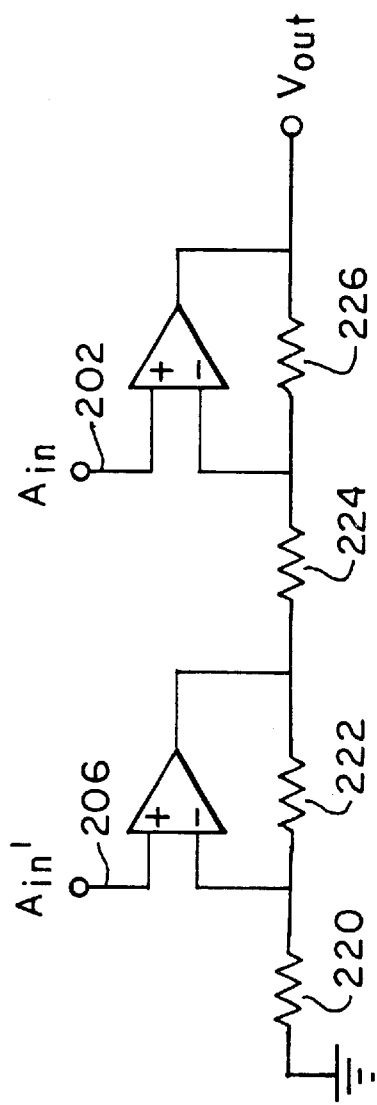
FIG. 2A is a conceptual circuit design for implementing the programmable gain preamplifier of FIG. 2.

A circuit for implementing the programmable gain preamplifier block 204 of FIG. 2 is shown in FIG. 2A. The circuit of FIG. 2A operates as a differential amplifier in which two opamps are provided with each opamp's noninverting input utilized as an input to the differential amplifier. Thus, the Ain 202 and Ain' 206 signals are provided to the noninverting inputs as shown. The resistors 220, 222, 224, and 226 may be programmably set at the appropriate values to achieve the desired gain. The configuration of FIG. 2A provides a differential amplifier having two opamps coupled in series with the inputs to the differential amplifier provided at the noninverting inputs of each opamp. The output of the first opamp is coupled to the inverting input of the second opamp (through a resistor) and the output of the differential amplifier is provided at the output of the second opamp.

Figure 3A:
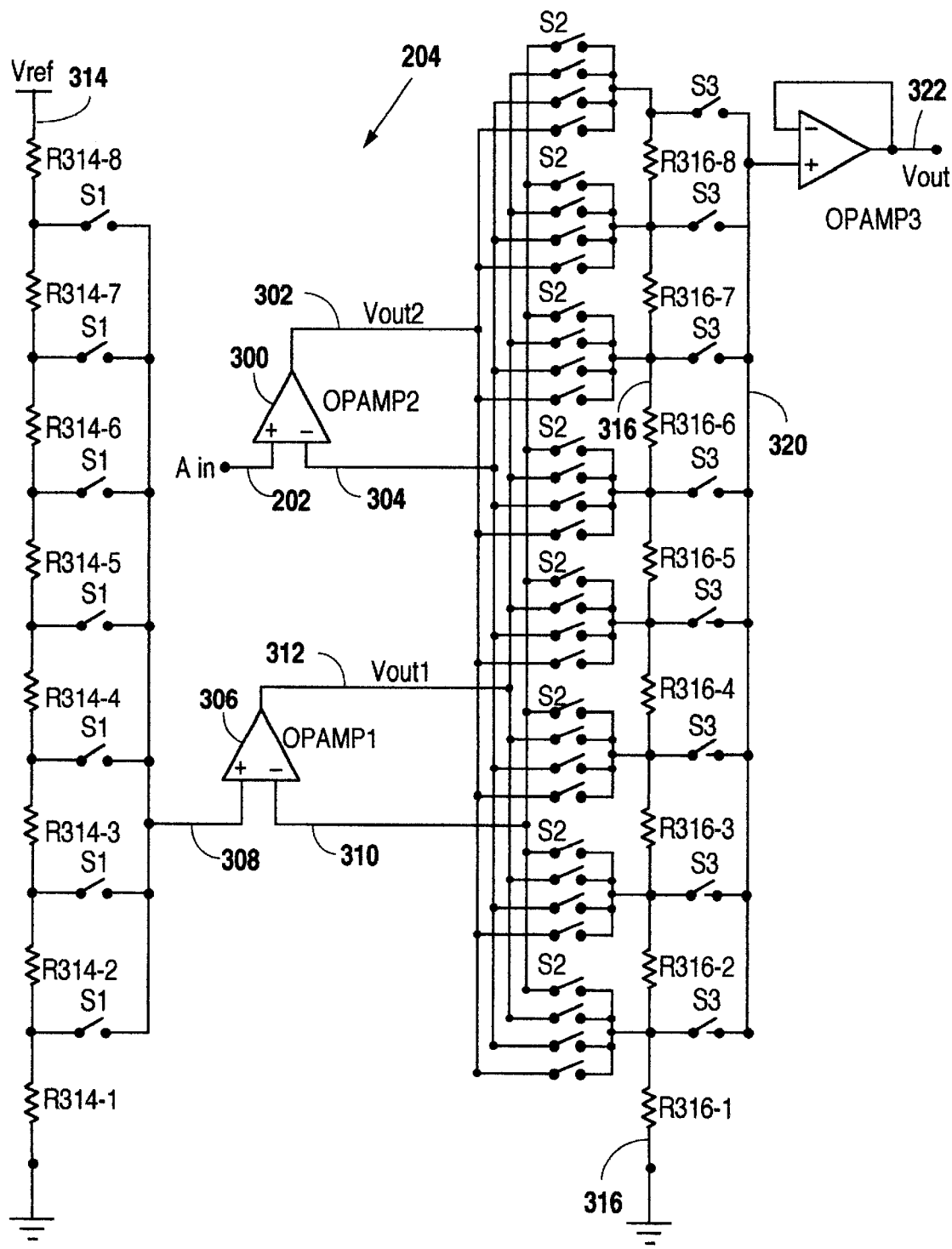
FIGS. 3A–3F illustrate one circuit design for implementing the programmable gain preamplifier disclosed herein.

A programmable circuit for providing the functionality of the circuit of FIG. 2A is shown in more detail in FIG. 3A. As shown in FIG. 3A, the Ain 202 signal is provided to the opamp 300 (OPAMP2) at the noninverting input of the opamp. Opamp 306 (OPAMP1) is provided with an input voltage 308 at its noninverting input. The noninverting input voltage 308 acts to implement the estimated signal Ain', although as will be described below, the input voltage 308 is only a function of the desired or actual estimated signal due to the manner in which the circuit of FIG. 3A is operated. OPAMP3 is configured as an output buffer to provide the preamplifier block output VOUT 322.

The noninverting input voltage 308 to OPAMP1 is provided from a first resistor string 314. The resistor string 314 includes a plurality of resistors R314-1–R314-8 which are connected between a reference voltage Vref and ground. The resistor string 314 is coupled to the noninverting input voltage 308 through a plurality of switches S1. The output 302 (Vout2) of OPAMP2, the inverting input 304 of OPAMP2, the output 312 (Vout1) of OPAMP1, and the inverting input 310 of the OPAMP1 may all be switchably coupled to a second resistor string 316 through a plurality of switches S2. The resistor string 316 includes a plurality of resistors R316-1–R316-8 as shown. For ease of illustration, the resistor strings 314 and 316 are shown as being comprised of eight resistors. However, it will be recognized that resistor strings of other lengths may be utilized. In one embodiment, both resistor strings may be composed of 64 resistors. All the resistors of both strings may be configured to have the same resistance and ideally both resistor strings may have similar layouts which are found empirically to minimize systematic errors in the fabrication of the resistor strings.

As will be described in more detail below, resistor string 314 and switches S1 form a digital to analog converter with an output on line 308. By selectively closing one of the switches S1, a selected voltage may be provided to the noninverting input of the OPAMP1. In this manner a voltage to implement the effect of subtracting the estimated Ain' signal is provided to the differential amplifier configuration. Thus, the first resistor string provides a voltage related to the estimated input. The second resistor string 316 is utilized to achieve a digitally programmable gain by selectively closing switches S2 as described below. In the 64 resistor embodiment mentioned above, gain values from 1 to 32 may be digitally programmed by selectively closing switches S2. Switches S3 connect the appropriate tap of the second resistor string 316 to line 320 so that the desired output voltage will be provided to the buffer amplifier OPAMP3, as also described below.

Figure 3B:
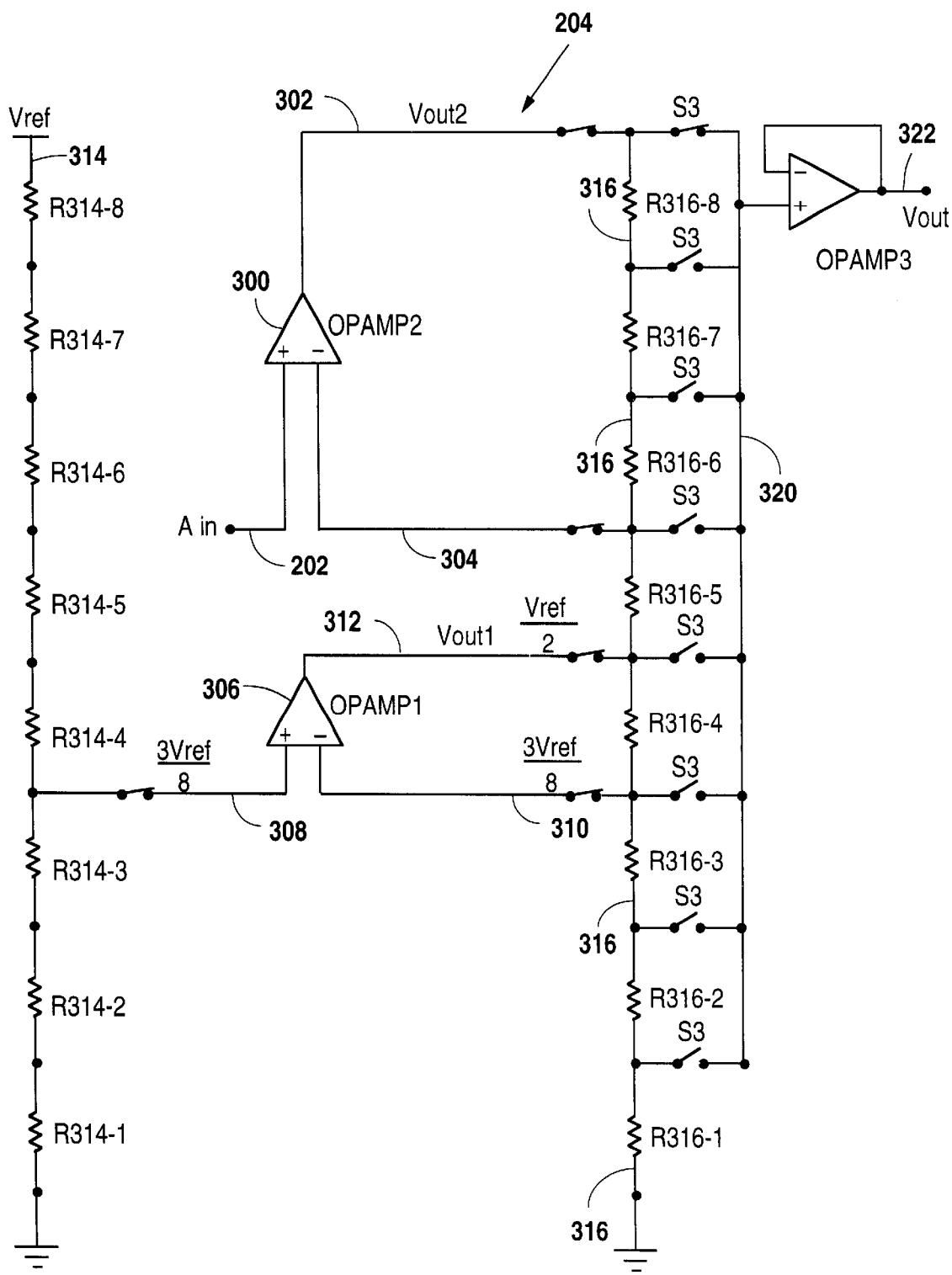

FIGS. 3B–3F provide illustrative examples as to how the preamplifier block of FIG. 3A is configured to provide a desired gain and Ain' estimation effect. The gain may be set by selectively coupling X−1 resistors between the output Vout2 of OPAMP2 and the inverting input 304 of OPAMP2, where the gain G=X. In the examples of FIGS. 3B–3F, the illustrative gain utilized is G=4. Thus, as shown in FIG. 3B, resistors R316-8, R316-7, and R316-6 are coupled between the output Vout2 of OPAMP2 and the inverting input 304 of OPAMP2. Similarly, three resistors are coupled between the output Vout2 of OPAMP2 and the inverting input 304 of OPAMP2 in FIGS. 3C–3F.

Figure 3C:
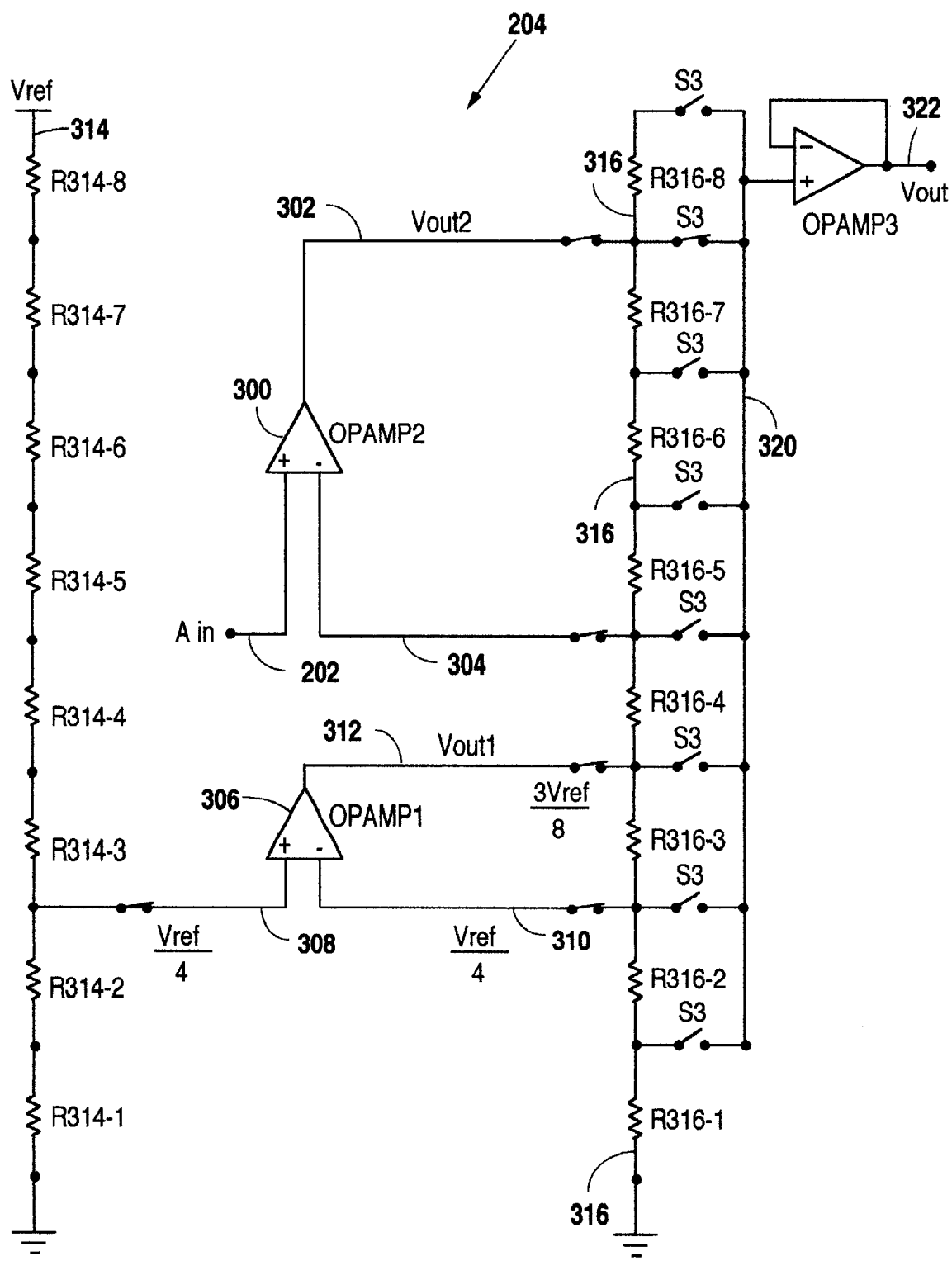
Figure 3D:
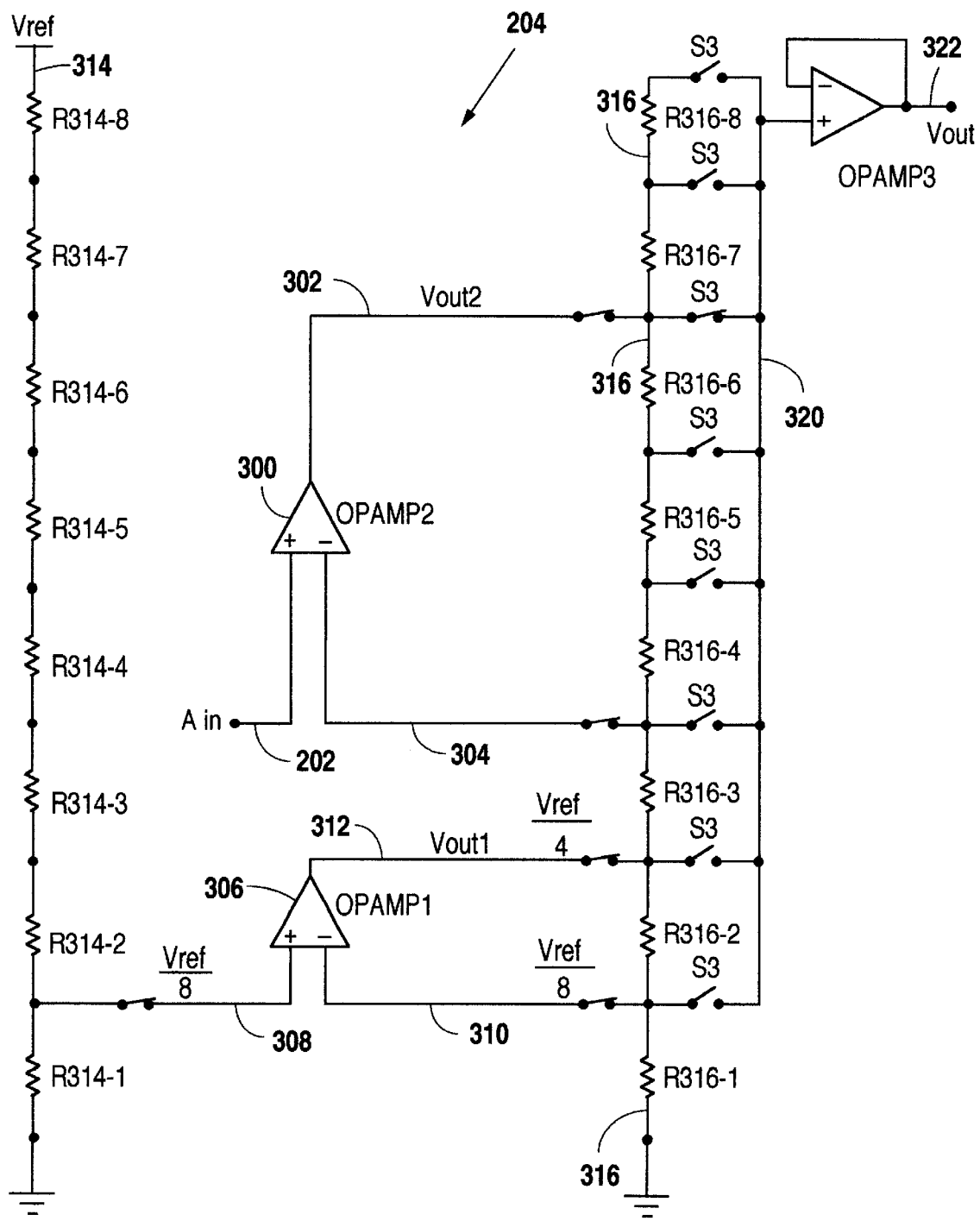
Figure 3E:
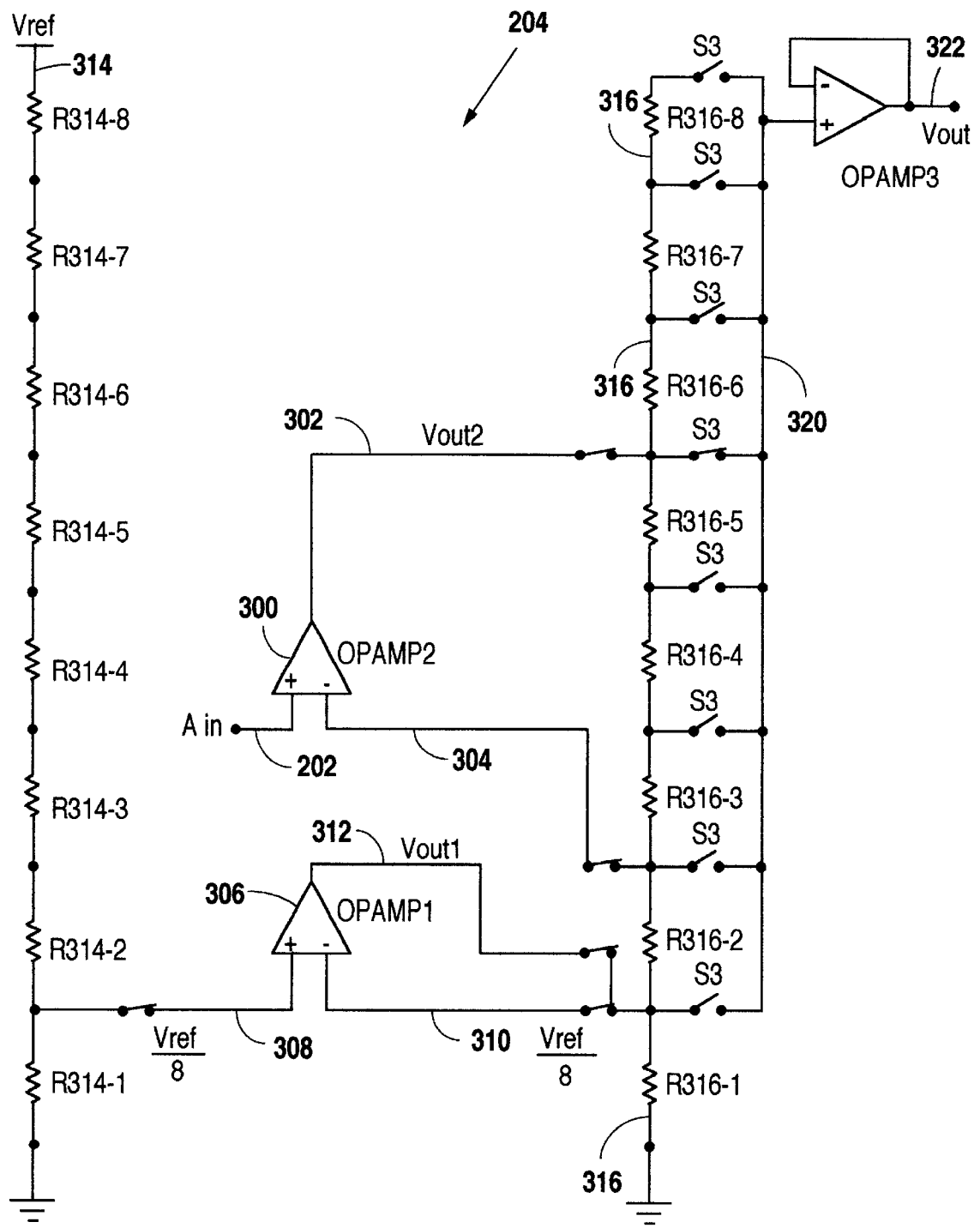
Figure 3F:
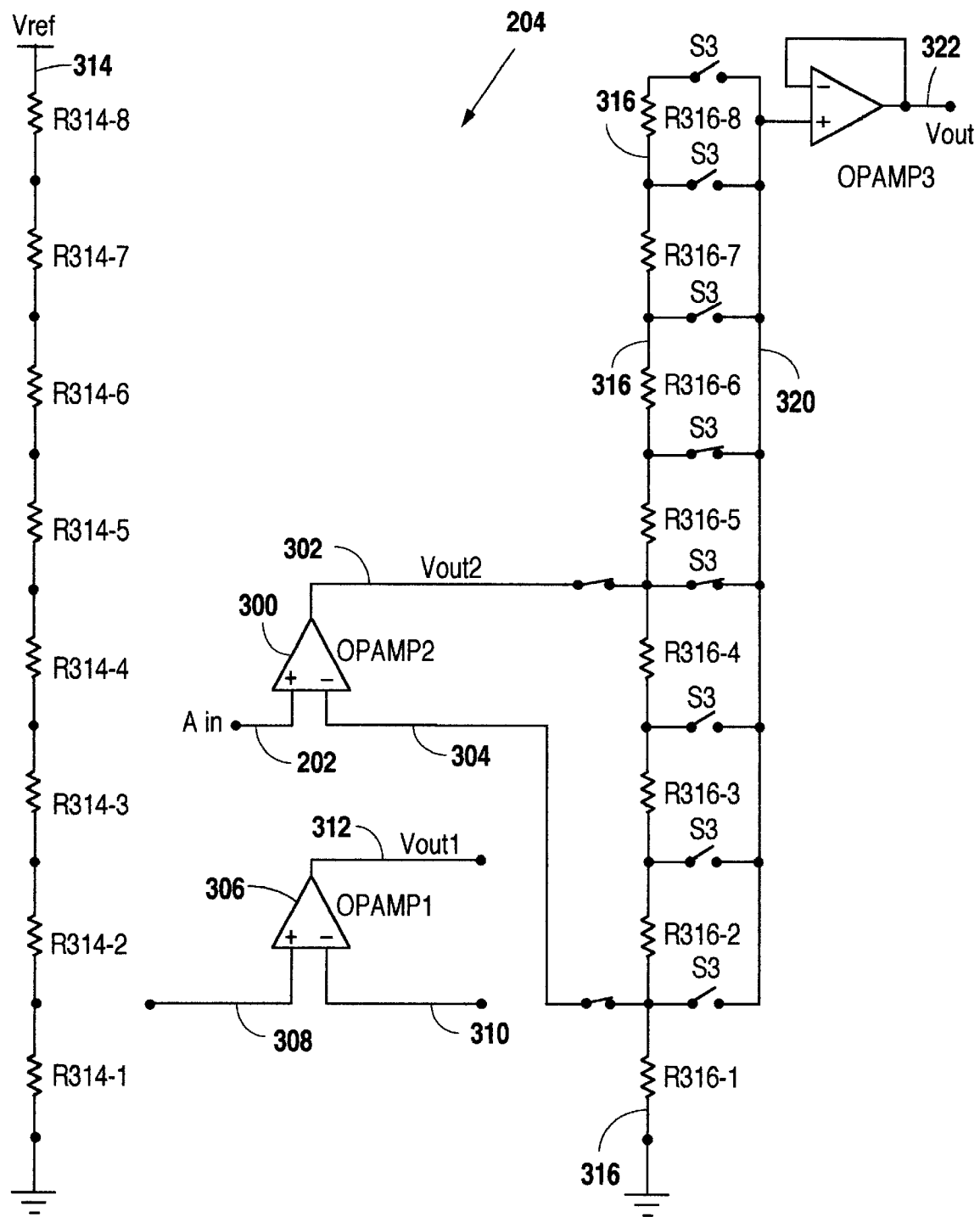

In each configuration of FIGS. 3B–3E, the noninverting input 308 is selectively coupled to one tap of the resistor string 314 depending upon the estimated value for Ain'. Thus, for different Ain' estimations, a different tap of the resistor string 314 may be provided to the noninverting input 308. The inverting input 310 of OPAMP1 is then coupled to the equivalent tap of resistor string 316. The configurations for different Ain' estimations are shown in FIGS. 3B–3F. Thus as shown in FIG. 3B, the tap above resistor R314-3 is coupled to the noninverting input 308 of OPAMP1 (a voltage level of 3 Vref/8) and likewise the inverting input 310 of OPAMP1 is coupled to the tap above resistor R316-3. As shown in FIG. 3C, the tap above resistor R314-2 is coupled to the noninverting input 308 of OPAMP1 (a voltage level of 1 Vref/4). As shown in FIGS. 3D and 3E, the tap above resistor R314-1 is coupled to the noninverting input 308 of OPAMP1 (a voltage level of 1 Vref/8). In each configuration the corresponding tap of resistor string 316 is selectively coupled to the inverting input 310 of OPAMP1 as shown. In the embodiment of FIG. 3F, Ain' is near zero, and the OPAMP1 output is not used.

In each case shown in FIGS. 3B–3E, the output Vout1 of OPAMP1 is selectively coupled to the resistor string 316 at a location of one resistor above the location that the inverting input 310 is coupled. The inverting input 304 of OPAMP2 is then coupled to the resistor string 316 at a location of one resistor above the location that the Vout1 of OPAMP1 is coupled. The output Vout2 of the OPAMP2 is then selectively coupled through a switch S2 to the resistor string 316 at the appropriate number of resistors above the inverting input 304 that is required to achieve the desired gain. A small voltage drop will result through switch S2, however as explained in more detail below, the voltage at the resistor string 316 will be independent of the switch S2 resistance by virtue of negative feedback. As mentioned above, the illustrative gain of FIGS. 3B–3F is G=4, and thus, three resistors are placed between the output Vout2 and the inverting input 304. In each configuration of FIGS. 3B–3F, one of the switches S3 is closed so that the voltage at the resistor string 316 may be coupled to line 320 (the noninverting input of OPAMP3). The overall preamplifier output (VOUT) is merely the voltage at the noninverting input of OPAMP3.

The equations below show the transfer function for each of the configurations of FIGS. 3B–3F. It will be noted that the gain in these embodiments was configured for G=4.

$$\text{FIG. 3b: } VOUT = 4\left(Ain - \frac{3}{8}Vref\right)$$

$$\text{FIG. 3C: } VOUT = 4\left(Ain - \frac{9}{32}Vref\right)$$

FIG. 3D: $VOUT = 4\left(Ain - \frac{3}{16}Vref\right)$

FIG. 3E: $VOUT = 4\left(Ain - \frac{3}{32}Vref\right)$

FIG. 3F: $VOUT = 4Ain$

When compared to the generalized equation VOUT=G(Ain−Ain'), the equations above demonstrate the effective Ain' that is obtained by using the configurations of FIGS. 3B–3F. A correlation or mapping table may be established to correlate the appropriate tap to be selected for a given gain level to achieve the desired effective Ain' estimation voltage. It is noted that the voltage at the noninverting input 308 is not the actual Ain' estimation voltage, but rather the effective Ain' voltage that is obtained is dependent upon the gain level selected and the voltage at the noninverting input 308. The general equation which characterizes the preamplifier is:

$$VOUT = GAin - (G-1)Vref\left(\frac{1+n}{N}\right)$$

where N is the number of resistors in the resistor string 314 and n is the tap number that is coupled to the noninverting input 308 of OPAMP1 (i.e., in FIG. 3B the tap coupled to the noninverting input is the tap above resistor R314-3 and thus n=3).

The preamplifier circuit of FIG. 3A may be readily calibrated to calculate the gain and offset of the amplifier topology. Because the resistor strings 314 and 316 will have some resistance variations and errors, the resistor strings may first be calibrated to a relatively high precision (for example 20 bit precision). The resistor string 314 may be calibrated with a dc accurate delta sigma ADC. For example, a 6 bit resistor string (64 resistors) may be calibrated with a 20 bit delta sigma ADC. The calibrated resistance values of the resistor string 314 may then be used in the resistor string 316 calibration. Using the calibrated resistor values of the resistor string 314, the preamplifier calibration may then be performed by recognizing that VOUT is a linear function of Ain for a given Ain' and that this equation may be described by a gain variable and an offset variable. Two different known values of Ain (provided by the resistor string 314) may then be used to generate two different VOUT values (VOUT being measured accurately, for example with the same 20 bit delta sigma ADC used to calibrate the resistor string 314). Knowing VOUT for two different Ain values allows the linear equation to be solved to obtain the gain and offset values. Each preamplifier network topology (i.e., all allowable combinations of tap connections) may have unique gain and offset calibration values. Thus, the calibration may be performed for every combination of gain G and the allowable input opamp tap connections.

In order to provide for amplifier headroom in the presence of gained amplifier offsets and estimation error, it may be desirable to limit the swing of VOUT. Thus, for example, VOUT may be limited to a range of Vref/4 to 3 Vref/4 (half of the ADC range). The corresponding limits on the input Ain are thus:

Lower Limit: $Ain = \frac{Vref}{4G} + \left(\frac{G-1}{G}\right)Vref\left(\frac{1+n}{N}\right)$ Upper Limit: $Ain = \frac{3Vref}{4G} + \left(\frac{G-1}{G}\right)Vref\left(\frac{1+n}{N}\right)$ It will be recognized that the swing limits shown above for VOUT are merely exemplary and other limits may be utilized, for example only ¼ of the ADC range may be allocated for offsets.

Figure 4A:
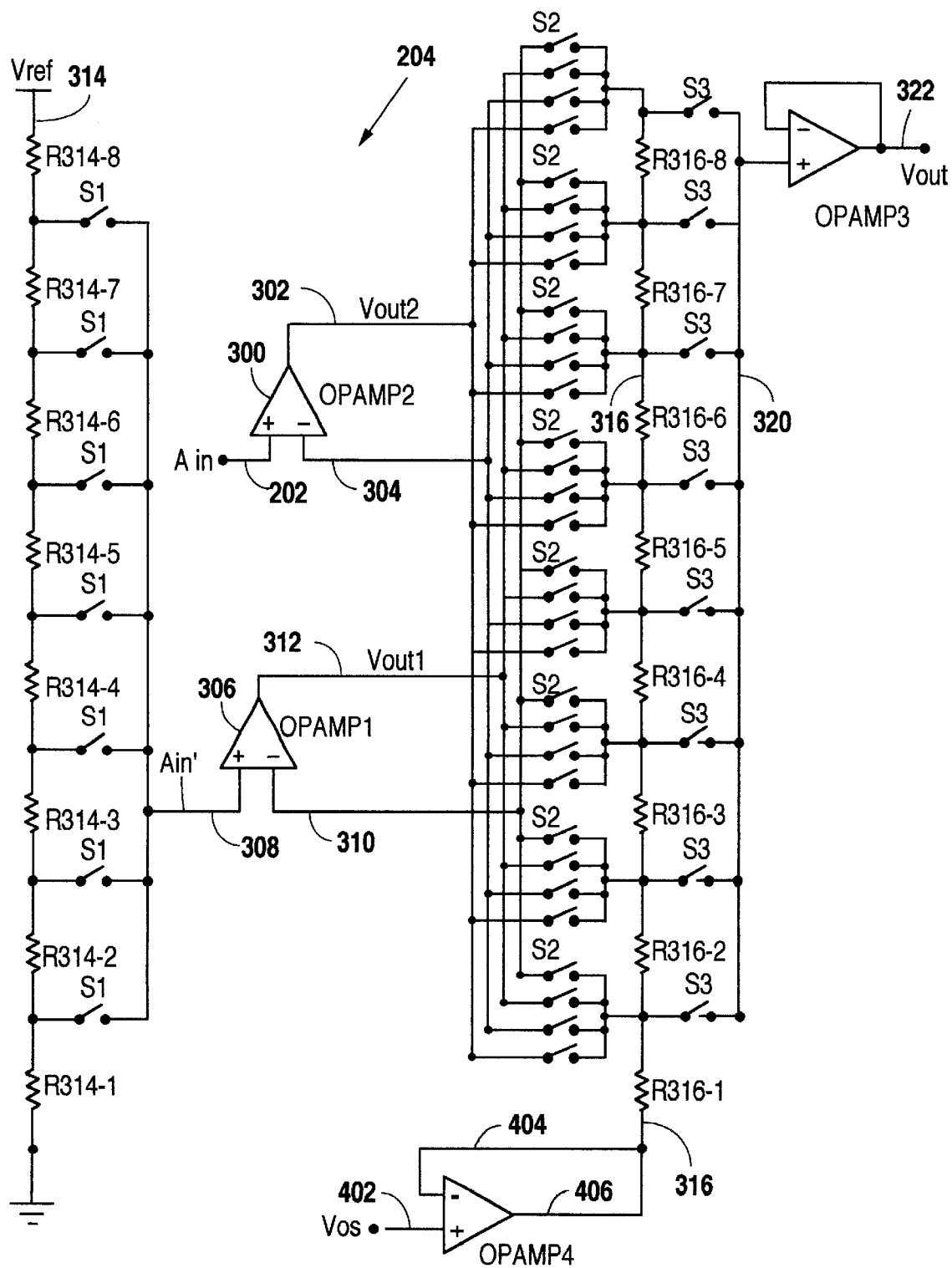
FIGS. 4A–4B illustrate another circuit design for implementing the programmable gain preamplifier disclosed herein.
Figure 4B:
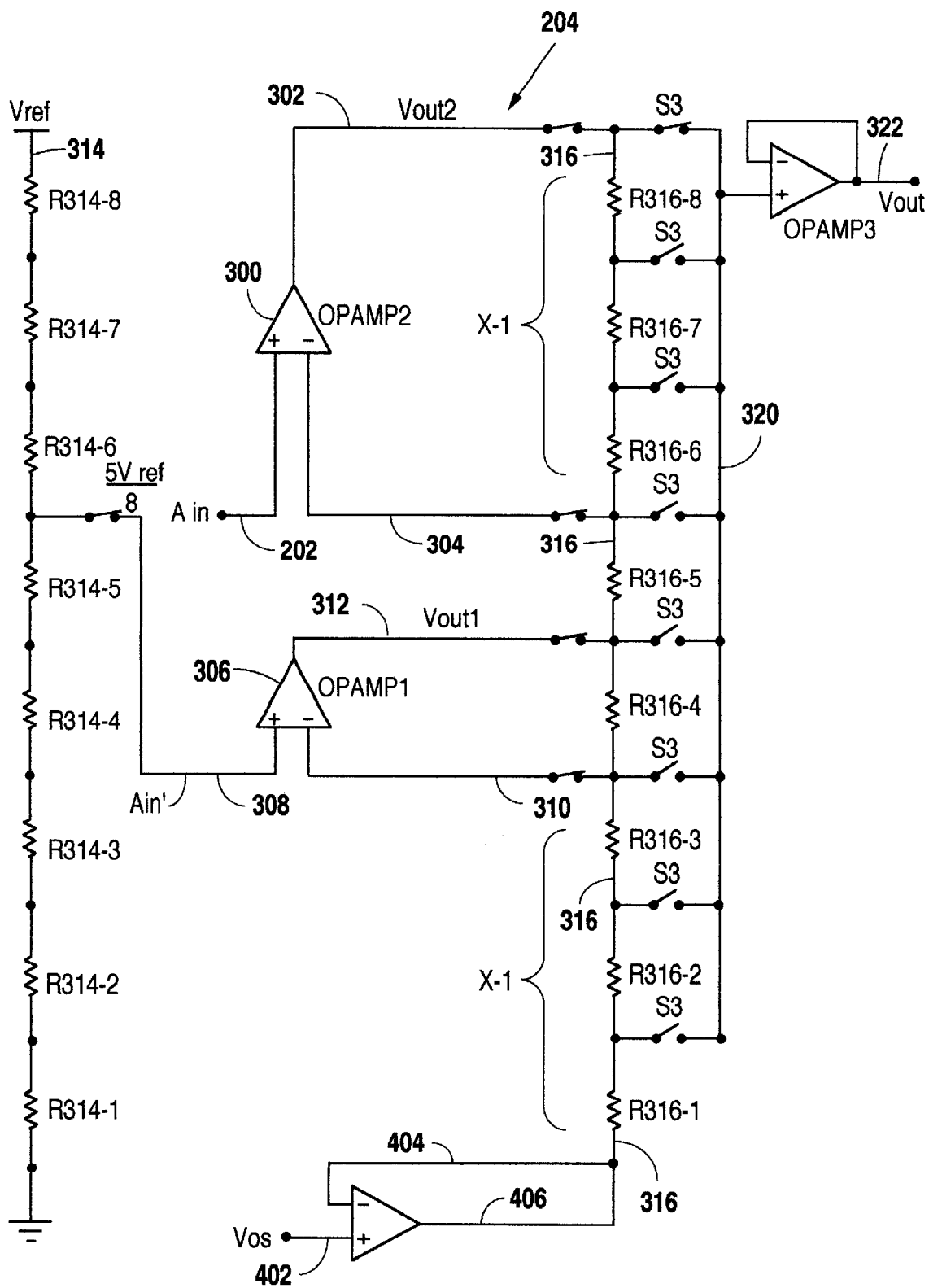

An alternative preamplifier configuration which may be utilized to obtain the generalized functionality of VOUT=G(Ain−Ain') is shown in FIGS. 4A–4B. The embodiment of FIG. 4A is similar to the embodiment of FIG. 3A except for the addition of OPAMP4 which has its output 406 and inverting input 404 coupled to the bottom of resistor string 316. The noninverting input 402 of the OPAMP4 is coupled to an offset voltage Vos. The OPAMP4 connection to the bottom of resistor string 316 may also use a force/sense arrangement similar to that described in FIG. 5D below. In operation the configuration of FIG. 4A is switched differently than the configuration of FIG. 3A. In particular, the configuration of FIG. 4A is operated with the switch S2 settings being independent of the switch S1 settings (as opposed to the configurations of FIGS. 3B–3E in which the corresponding tap from resistor string 314 and resistor string 316 are coupled to the noninverting input 308 and the inverting input 310 of the OPAMP1 respectively). As described with respect to FIG. 4B, the configuration of FIG. 4A allows for a more ideal separation of the Ain' and G effects within the preamplifier.

In the configuration of FIGS. 4A and 4B, the Ain' estimate is provided to the noninverting input 308 of OPAMP1. In the example of FIG. 4B, the Ain' estimate is (⅝)Vref. The switches S2 are configured so that for a desired gain G=X, X−1 resistors are coupled between the OPAMP2 output Vout2 and the OPAMP2 inverting input 304. Similarly, the switches S2 are configured so that X−1 resistors are coupled between the OPAMP1 output Vout1 and the OPAMP4 input 404. A single resistor is coupled between the OPAMP1 output Vout1 and the OPAMP2 inverting input 304. The example shown in FIG. 4B demonstrates a configuration having resistor strings comprised of 8 resistors and a gain=4. As with the configurations of FIGS. 3A–3F, the resistor string length is shown for illustrative purposes and an actual implementation may utilize other numbers of resistors. For example, a preamplifier which is to operate with gains of 1 to 32 may be configured with a resistor string 316 which has 64 resistors. It will be recognized that other resistor string lengths may be utilized to achieve more or less gain options or voltage levels for the noninverting input 308. Moreover, the lengths of the resistor strings 314 and 316 are not required to be the same.

The generalized equation that characterizes the circuitry of FIGS. 4A and 4B is:

VOUT=Vos+G(Ain−Ain')

The optimum Vos value may be Vref/2 if the ADC coupled to the preamplifier converts from 0 to Vref. In order for the OPAMP1 of FIGS. 4A and 4B to operate properly, the output of OPAMP1 should be greater than a minimum, Vmin, where Vmin allows some output stage headroom (typically 100–150 mV) above the negative supply rail. Solving the relationship between Vout1 and Ain' demonstrates that:

$$Ain' > \frac{Vref}{2N} + V\min\left(\frac{N-1}{N}\right)$$

The calibration techniques discussed above may also be utilized for calibrating the circuitry of FIGS. 4A and 4B.

It will be recognized from the discussion above and FIGS. 4A and 4B that the inputs Ain and Ain' may be switched such that the Ain signal is coupled to OPAMP1's noninverting input 308 and the Ain' estimation signal is coupled to OPAMP2's noninverting input 202. Switching the inputs of FIG. 4A results in a change in the sign of the preamplifiers' gained difference (the G(Ain–Ain') component of the preamplifier output). The advantages and benefits of the disclosed preamplifier structures and techniques will still be obtained.

The choice between the use of the preamplifier configurations of FIGS. 3A–3F and the preamplifier configurations of FIGS. 4A–4B need not be a mutually exclusive selection. For example, a preamplifier may be configured as shown in FIGS. 3A–3F when low gains are desired while the preamplifier may be switched to the configuration of FIGS. 4A–4B when high gains are desired. The type of preamplifier configuration (FIG. 3A–3F type vs. FIG. 4A–4B type) may also be programmable. In the example mentioned above, the type of preamplifier configuration utilized may be programmed based upon the desired gain. However, other factors may also be considered when selecting which preamplifier configuration to utilize, including characteristics of the analog input signal, relative magnitudes of opamp and resistor noise, the type of signal processing performed downstream of the preamplifier, etc. Further, other types of preamplifier configurations may be programmably used with any of the preamplifier configurations shown herein. For example, the preamplifiers shown herein may be utilized for some gain and/or estimate levels while other preamplifiers may be used for other gain and/or estimate levels.

A variety of circuit and layout techniques may be utilized to optimize the performance and characteristics of the preamplifiers disclosed herein. These circuit and layout techniques may relate to the types of opamps utilized, the arrangement of the resistor strings, the implementation of the switches, temperature compensation, etc. Some circuit and layout techniques which may be utilized to implement the programmable gain preamplifier are discussed below, however, the programmable gain preamplifier disclosed herein is not limited to the specific implementation described. Moreover, the improvement techniques disclosed herein may be used together or independently of each other.

Any of a wide variety of opamps may be utilized to implement OPAMP 1, OPAMP2, and OPAMP3. For example, OPAMP1 and OPAMP3 may be implemented with standard voltage feedback opamps since these opamps are not used to provide a wide gain range. OPAMP2, however, is configured to operate over a wider gain range (for example 2 to 32). Because of this gain range, OPAMP2 may be implemented as a current feedback opamp. Current feedback opamps are known in the art, for example as shown in U.S. Pat. No. 4,628,279 to Nelson. Such opamps provide a –3 dB bandwidth that is relatively independent of the closed loop gain. This provides a relatively constant noise bandwidth as a function of gain and thus may lessen the variation in antialiasing filter requirements downstream of the preamplifier.

The opamps utilized in the programmable gain preamplifier may also be CMOS chopper stabilized opamps. Chopper stabilized opamps reduce the poor 1/f noise and offset characteristics of non-chopper CMOS opamps. Chopper stabilized opamps are well known in the art, for example as shown in Allen and Holberg, *CMOS Analog Circuit Design*, Oxford University Press, p. 490–497, (1984), the disclosure of which is incorporated herein by reference. The use of chopper stabilized opamps is particularly beneficial if the signal processing circuitry downstream of the preamplifier is an ADC circuit. In an ADC application, the ADC may perform one conversion with all the opamps in the first chopper phase of a chopper signal and then the ADC may perform the next conversion with all the opamps in the second chopper phase of a chopper signal. The two ADC conversion results may then be averaged to remove offset and noise. Thus, a given final ADC digital output may be an output obtained as an average of at least two ADC conversions. Half of the ADC conversions being averaged may be performed on an analog input provided from the preamplifier while the preamplifier is in the first chopper phase and the other half of the ADC conversions may be performed on an analog input provided from the preamplifier while the preamplifier is in the second chopper phase. All of the opamps in FIGS. 3A and 4A may be chopped in this manner. Thus, a preamplifier having chopper stabilized opamps is provided and the chopping may be performed synchronously with at least some operations of the downstream signal processing circuitry, for example synchronously with ADC conversion cycles. The chopping need not be performed at all times. For example, a user supplied chopping control signal may enable chopping. Further, chopping may be applied for high preamplifier gains but not at low gain values. Chopping and its attendant loss of ADC throughput is also unnecessary in ac-coupled applications not sensitive to offset and low frequency noise.

The accuracy and temperature drift of the resistor strings 314 and 316 will significantly impact the performance of the programmable gain preamplifiers disclosed herein. In order to improve the accuracy of the resistor strings, laser trimming of the resistors may be utilized or the resistors may be digitally calibrated or both. As mentioned above, the temperature drift of the resistor string is also important. For example, if the resistors are formed in polysilicon, the resistor ratios may demonstrate a temperature drift of 10 ppm/° C. (individual resistances have resistance value drifts of order 600 ppm/° C.) over the temperature range of 25° C. to 125° C. Thus, the preamplifiers disclosed herein are particularly suited for techniques that minimize the ratio drift of resistor strings. One such technique relates to the location of the contacts between the polysilicon resistors and the metallization layers that connect to the resistors. In order to decrease the temperature drift of the resistor structure it is desirable to place the contacts and taps to the resistor string outside the current path of the resistor string.

FIGS. 5A and 5B illustrate a technique for placing the contacts to the resistor strings outside of the current path of the resistor string. FIG. 5A illustrates a portion of the resistor string 316 of FIGS. 3A and 4A. As shown in FIG. 5A, taps 512 are coupled between the resistors and switches S2. This resistor string circuit may be implemented in an integrated circuit by use of the structure shown in FIG. 5B. As shown in FIG. 5B, the resistors are formed in a polysilicon layer 500. Each resistor corresponds to a length or segment of polysilicon such as segments 502, 504, and 506. Metallization layers 522 couple the taps 512 of the resistor string to the switches S2 (not shown). As can be seen from FIG. 5B, the contacts 515 which electrically connect the polysilicon and metallization layers are all located outside of the current path I of the resistor string. Ideally all of the contacts to the resistor string taps may be placed substantially outside of the current path of the resistor and sense connections can be provided at the top and bottom of the strings. Additional exemplary resistor string configurations having all the tap contacts out of the resistor string current path are shown in FIGS 5C and 5D. As shown in FIG. 5C, the resistor layer 500 (for example polysilicon) has a series of taps 512 that each have a contact 515 placed out of the resistor string current path. One end of the resistor string is shown coupled through a contact 534 to an external source 536 for providing Vref (Vref may alternatively be generated within the integrated circuit). The other end of resistor string is coupled through a contact 532 to another supply 538 (for example an external ground connection). Inherently the voltage source contacts 534 and 532 will be within the resistor string current path, and as used herein, removing all the resistor string tap contacts from the current path does not require such source contacts to be removed from the path. FIG. 5D illustrates another method of coupling a reference voltage and ground to the resistor string which as used herein also illustrates all tap contacts being located out of the current path (i.e., all but the supply contacts). As shown in FIG. 5D, a force/sense scheme with opamps 560 may be utilized. The opamps may be external to the preamplifier integrated circuit and connected through Vref sense pin 550, Vref force pin 552, GND sense pin 554 and GND force pin 556. Alternatively, the opamps may be internal to the preamplifier integrated circuit. It will also be recognized that the benefits of the present disclosure may still be realized if only a substantial majority of the tap contacts are located outside of the resistor string current path.

By providing contacts to the resistor strings that are outside of the current path of the resistor string, the individual resistors of the resistor string may exhibit low temperature drifts relative to each other. Thus, though it may be acceptable for the absolute temperature coefficient drift of each resistor to be large (for example 600 ppm/° C.), it is desirable for the difference in the drift between nominally identical resistors to be small. For example, utilizing the resistor string techniques discussed herein, a resistor string comprised of resistors with an absolute temperature drift of 600 ppm/° C. may have a relative drift between any two resistors that is less than 1% of the individual absolute temperature drift of the single resistor. Resistor strings having resistors with a relative drift between resistors of less than 1% the drift of a single resistor may be characterized as low drift resistor strings. More preferably, a low drift resistor string will have a relative drift between resistors of less than 0.1% of the individual drift. Thus, for example, the techniques discussed herein may provide a low drift resistor string in which the relative drift between resistors is on the order of 0.3 ppm/° C. even though the resistor string is comprised of resistors which have an individual absolute drift of 600 ppm/° C.

Though shown in FIGS. 5A and 5B with respect to the second resistor string 316, this technique for placement of the contacts to the resistor string may also be utilized with the first resistor string 314. Thus, a homogeneous resistor string formed of a common resistive material having taps is provided. As mentioned above, the resistor values for the resistor strings may all be set to the same values, thus providing matching resistor strings. Other tap and contact layouts may also be utilized in addition to the layout shown in FIG. 5B in order to achieve the desired placement of contacts outside the resistor string current path. For example, the layout in U.S. Pat. No. 5,319,319 provides another resistor string having the taps and contacts located outside the current path.

Figure 1:
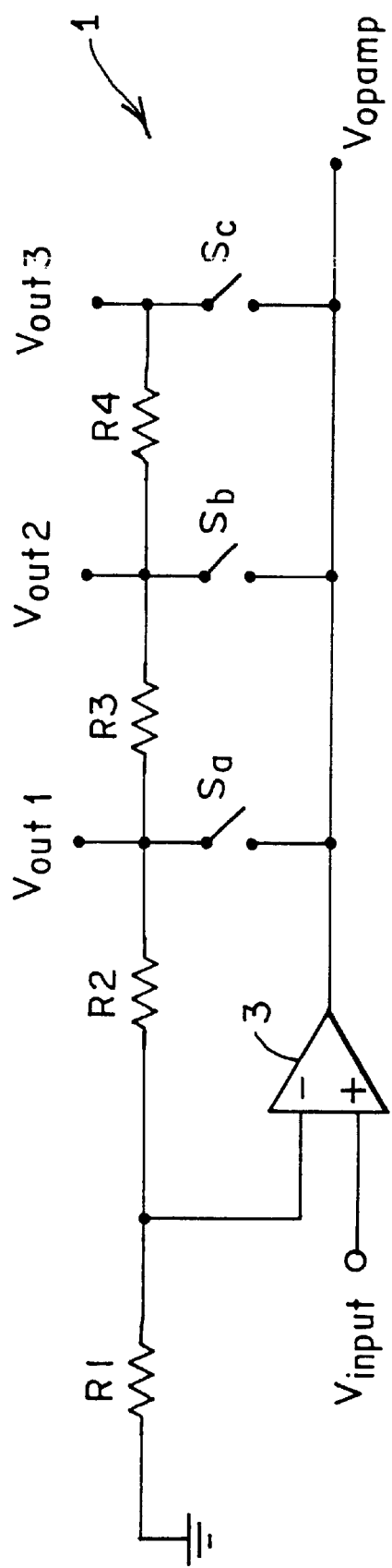
FIG. 1 shows an exemplary prior art programmable gain preamplifier.
Figure 5E:
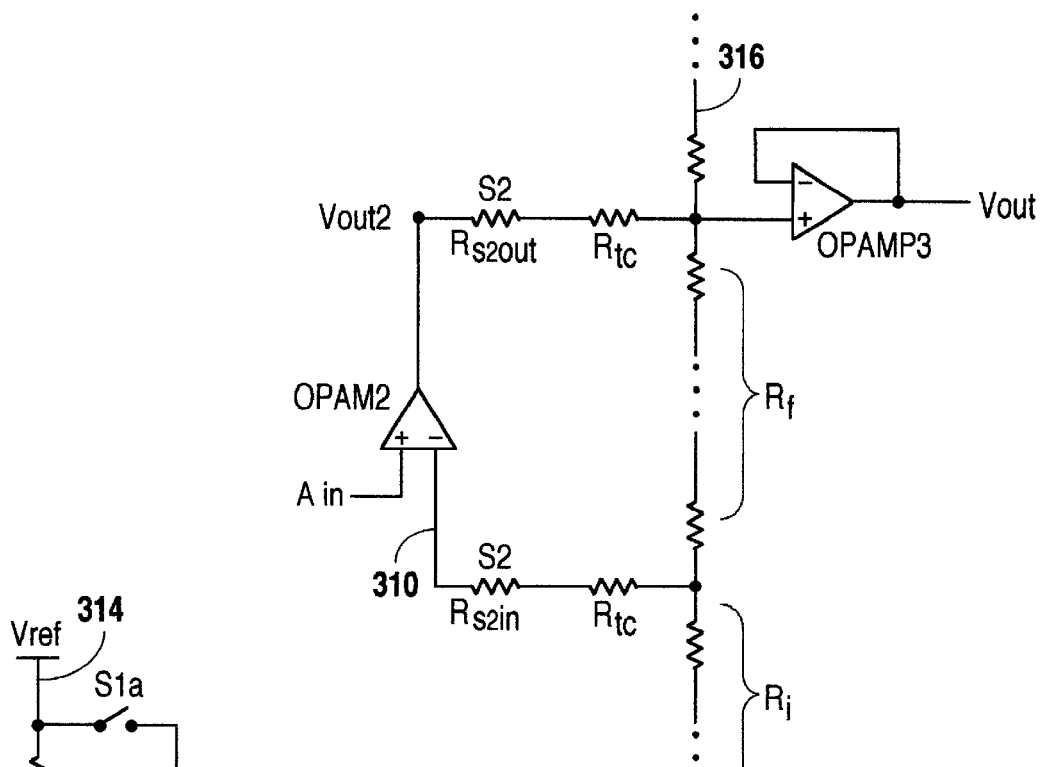
FIG. 5E illustrates a portion of a programmable gain preamplifier which may utilize the techniques for providing contacts out of a resistor string current path.

The placement of the resistor string tap contacts out of the current path is particularly advantageous when it is recognized that the output of the preamplifier may be independent of the switch resistance of the switches utilized to couple the opamps to the resistor strings (as mentioned above with reference to FIG. 1). More particularly, FIG. 5E illustrates a portion of the preamplifier circuit of FIGS. 3A and 4A. As shown in FIG. 5E, OPAMP2 is coupled to the resistor string 316 through closed switches S2. The switch S2 coupled between the OPAMP2 output Vout2 and the resistor string 316 has a resistance $R_{S2OUT}$ and the switch S2 coupled between the OPAMP2 inverting input 310 and the resistor string 316 has a resistance $R_{S2IN}$. The resistance of the tap and contact connecting the switches S2 to the resistor string 316 is shown as Rtc. Because no current flows into the OPAMP2 input, there is no voltage drop across the switch having the resistance $R_{S2IN}$ or the associated tap/contact resistance Rtc. Further, although current flows through the switch coupled to the OPAMP2 output and Vout2 is dependent upon the resistance of that switch and its associated tap and contact ($R_{S2OUT}$ and Rtc), it can be shown that the voltage VOUT at the resistor string is dependent only upon the input voltage, the resistance Rf, and the resistance Ri since:

$$VOUT = Ain\left(1 + \frac{Rf}{Ri}\right)$$

Thus, VOUT (and the preamplifier gain) may be independent of the temperature drift of the switch resistances and independent of the temperature drift of the tap and contact resistances. Thus, VOUT (and gain) will be independent of the series resistance of the tap connected to the switch and the associated resistance of the contact at that tap as long as the contacts are located out of the current path of the resistor string.

The preamplifier configurations shown herein, therefore, provide an output that applies a gain to the difference between the Ain signal and Ain' estimation signal and that gain is highly stable with very low temperature drift. The gain may be highly stable since the resistor strings that provide the Ain' estimation signal and that set the gain may be formed such that the resistor taps and associated contacts are all placed out of the resistor string current path (in a location such that drift in the contact resistance will not change either the Ain' estimation or the preamplifier gain).

Figure 6A:
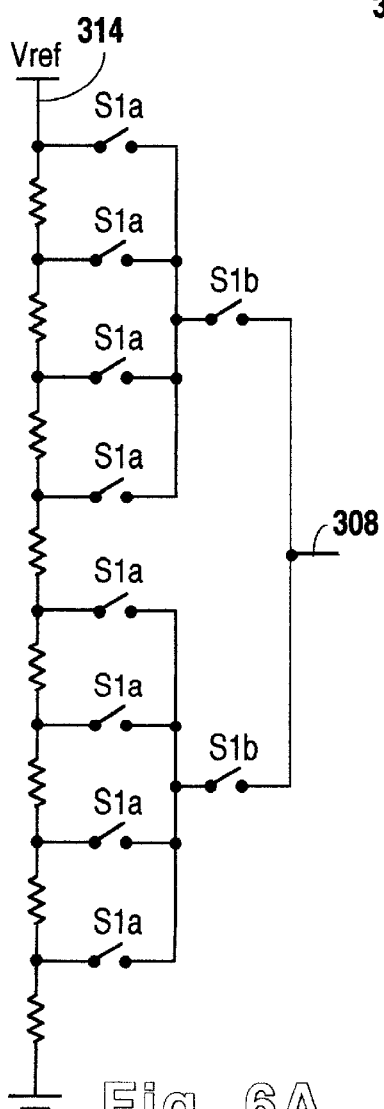
FIGS. 6A and 6B illustrate switching networks which may be utilized with the programmable gain preamplifiers disclosed herein.

The arrangement of the networks of switches S1, S2, and S3 may also impact the performance of the preamplifier circuitry. For example, the network of switches shown in FIG. 3A provide a single switch Si between each tap of the first resistor string and the noninverting input 308. However, tree type multiplexer switch networks having two or more layers of switches may provide faster switching for a given switch size. FIG. 6A shows a tree type multiplexer switching network for coupling the resistor string 314 to the noninverting input 308. As shown in the figure, any given resistor tap is selected by closing one first layer switch S1a and the corresponding second layer switch S1b. The tree type multiplexer switching network approach may also be utilized for switches S2 and S3. Moreover, more than two layers of switches may be utilized in the tree switching network. In addition, the tree type multiplexer switching networks for switches S1 and S2 may also incorporate the chopper switches utilized if the opamps are operated as a chopper stabilized opamps. Exemplary chopper switches may be seen in U.S. Pat. No. 5,039,989 to Welland et al. in FIG. 7 (switches 232, 234, 236, and 238), the disclosure of which is incorporated herein by reference. Through the use of a tree type multiplexer switching network, the chopper switches may be merged into the S1 and S2 switching networks, blurring the resistor string tapping and the chopper functions.

Figure 6B:
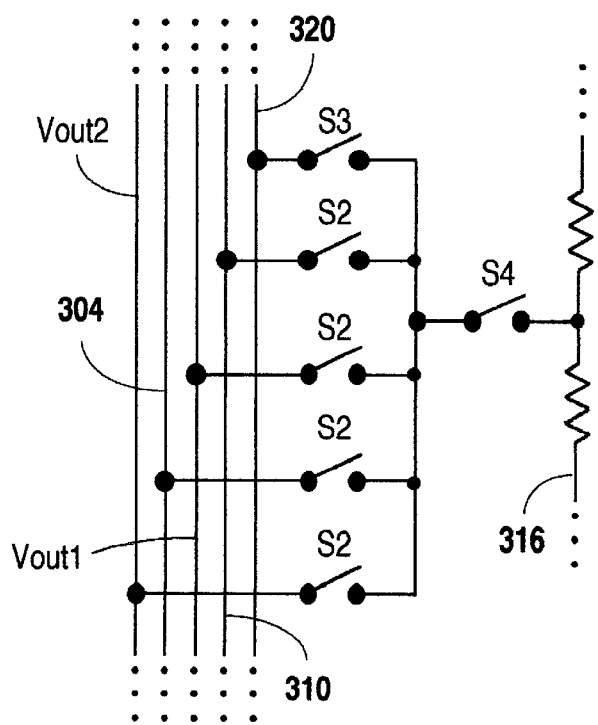

As shown conceptually in FIGS. 3A and 4A, each tap of the resistor string 316 that is coupled to the switches S2 and S3 may be coupled to a plurality of switches S2 because a given tap may be connected to an OPAMP1 input, OPAMP2 input, OPAMP3 input, OPAMP1 output or OPAMP2 output. However due to leakage considerations, it may be desirable to provide only one switch at each location where the resistor string is being tapped as shown in FIG. 6B. Thus, the resistor string 316 may be coupled through a switch S4 to the line 320 (OPAMP3 noninverting input), line 310 (OPAMP1 inverting), line Vout1 (OPAMP1 output), and line Vout2 (OPAMP2 output). In this manner only a single switch (S4) is directly connected to the resistor string 316 while the remaining switches S3 and S2 are coupled to the resistor string 316 through the switch S4. Ideally, switch S4 should have as high a value of switch resistance as thermal noise considerations will allow, since high switch resistance corresponds to a small switch size and lower parasitic leakage currents. When utilizing the circuit of FIG. 6B it is desirable to utilize the switching technique shown in FIG. 7 for coupling the noninverting input of OPAMP3 to the resistor string 316 as described in more detail below.

It will be noted that the circuitry of FIGS. 3A, 3B, and 6B show a single bus line for the OPAMP 1 inverting input 310 and a single bus line for the OPAMP2 inverting input 304. When chopper opamps are utilized, a separate bus line may be provided to the network of switches S2 for each of the chopped inputs (i.e., two bus lines for each inverting input). However, the bus line configuration shown in the figures may still be more desirable when chopper opamps are utilized.

Figure 7:
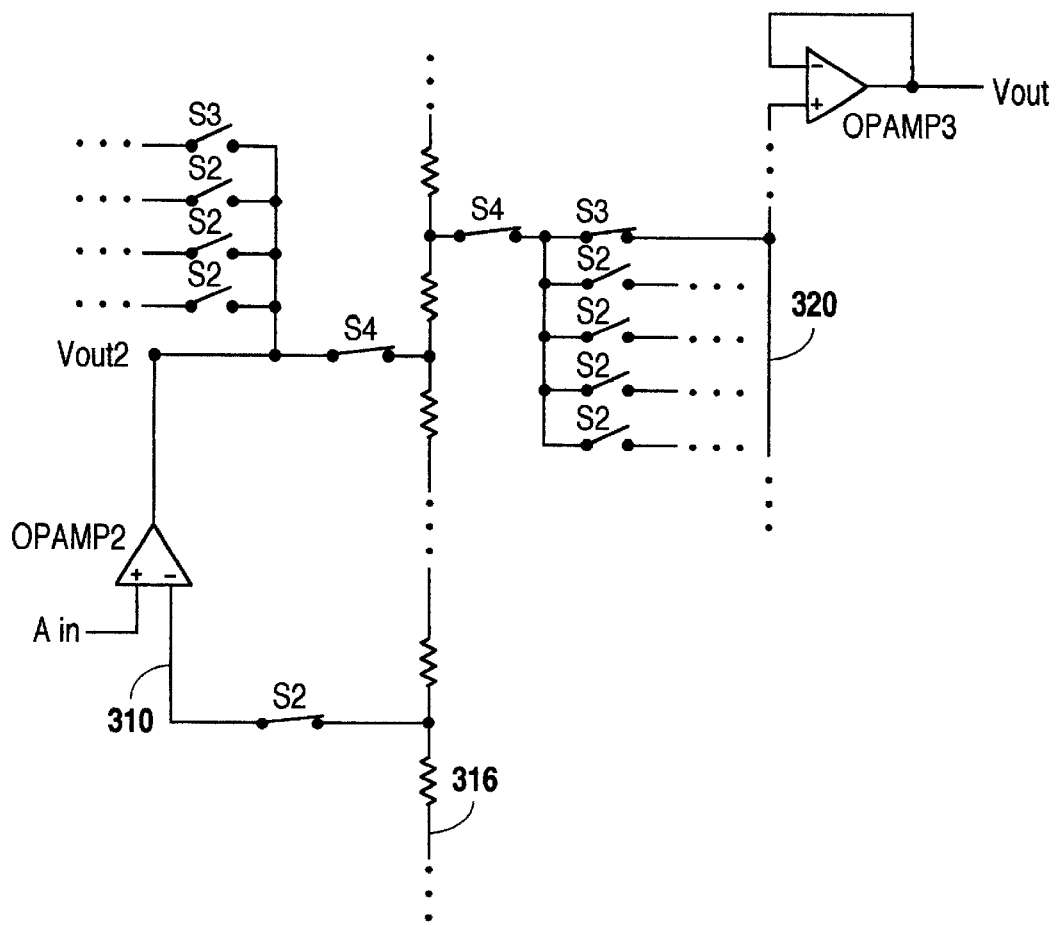
FIG. 7 illustrates a technique for coupling opamps to one of the resistor strings of the programmable gain preamplifiers disclosed herein.

Leakage characteristics may also be improved by adjusting which tap is coupled to the switch S3. As shown in FIG. 3B–3F and FIG. 4B, the same node along resistor string 316 that is connected to a closed switch S2 (coupled to the OPAMP2 output Vout2) and is also connected to a closed switch S3 (coupled to noninverting input of OPAMP3). By providing two switches at a single node, the leakage at a given node is doubled. However, an alternative configuration is shown in FIG. 7. In FIG. 7, rather than placing the closed switch S3 at the same node as the closed switch S2, the closed switch S3 is tied to a node one resistor above the location of the OPAMP2 output Vout2. The configuration of FIG. 7 will decrease the leakage since no current flows in the resistor string 316 above the OPAMP2 output (every tap above the OPAMP2 output will settle to the same voltage as the OPAMP2 output). Leakage through the switch S3 will, therefore, be decreased as compared to the configurations of FIGS. 3B–3F and FIG. 4B. The switching technique of FIG. 7 is also desirable when using switching connections such as shown in FIG. 6B. More particularly, the FIG. 7 technique helps to prevent nonlinearities and temperature dependent voltage drops which result from current flow in the switch coupling the output of OPAMP2 to the resistor string 316 from being coupled to the OPAMP3 input.

The programmable preamplifier techniques described herein provide a preamplifier having excellent stability and temperature coefficients. However since any amplifier topology will have some offset and gain temperature coefficients, it may be desirable to provide a mechanism to compensate for any temperature coefficients that exist. Such compensation may be achieved by creating calibration tables for different temperatures of the preamplifier. In order to create such tables the preamplifier may provide a temperature output indicative of the temperature of the preamplifier circuitry. The temperature coefficients for gain and offset at various temperatures may then be tabulated. The temperature measured by the preamplifier circuitry need not be highly accurate but rather merely stable and repeatable. In operation, the temperature of the preamplifier may be monitored and compensation tables may then be utilized to appropriately compensate for temperature effects. The preamplifier temperature information may be processed off chip or the compensation information may be integrally processed with the downstream signal processing circuitry.

The temperature of the preamplifier circuitry may be obtained by utilizing circuitry generally existing in most high precision preamplifiers. More particularly, the bandgap reference circuitry of the preamplifier master bias generator may have a Proportional To Absolute Temperature (PTAT) voltage node as is well known in the art. The PTAT voltage may be multiplexed into the OPAMP3 input whenever an indication of the preamplifier temperature is desired, or a separate buffer may provide full-time temperature indication on a separate preamplifier output pin.

The various preamplifier components and techniques disclosed herein may be constructed in a monolithic circuit implementation on a single integrated circuit. The signal processing circuitry (an ADC for example) coupled to the preamplifier output may also be included within the integrated circuit. Alternatively, the signal processing circuitry and the various elements of the preamplifier may be located external to the preamplifier. For example, the resistor strings may be located external to the integrated circuit. The Ain input signal and the Ain' estimation may be provided at input pins to the integrated circuit. The Ain' estimation signal may be, however, generated within the integrated circuit itself.

Thus, a programmable gain preamplifier is provided which has a low temperature drift and good dynamic range characteristics. The programmable gain preamplifier is provided which provides a programmable gain of the difference between two input signals (Ain and Ain' for example). One of the input signals (Ain') may be an estimation of the other input signal (Ain). The estimation input signal (or a signal related to the estimated input) may be generated by the use of a reference voltage and a first resistor string. More particularly, the reference voltage and the first resistor string may operate as a digital to analog converter (DAC) that converts a digital estimation signal to an analog estimation voltage. The analog estimation voltage operates as an analog voltage that is a function of (or the same as) the analog Ain' estimation signal. The first resistor string may provide the estimation voltage without loading the resistor string. Thus, the first resistor string may be simultaneously utilized by other circuitry, such as for example, a downstream ADC. The programmable preamplifier gain may be set by the use of a second resistor string and digitally programmable switches. Contacts to the resistor strings may be placed outside of the current path of each resistor string to provide highly stable resistor strings having a very low temperature drift. In one preamplifier embodiment, some or all of the opamps may be chopper stabilized opamps, at least one opamp may be a current feedback opamp, the resistor strings may be at least 64 resistors long and programmable gains from 1 to 32 may be provided.

Figure 8:
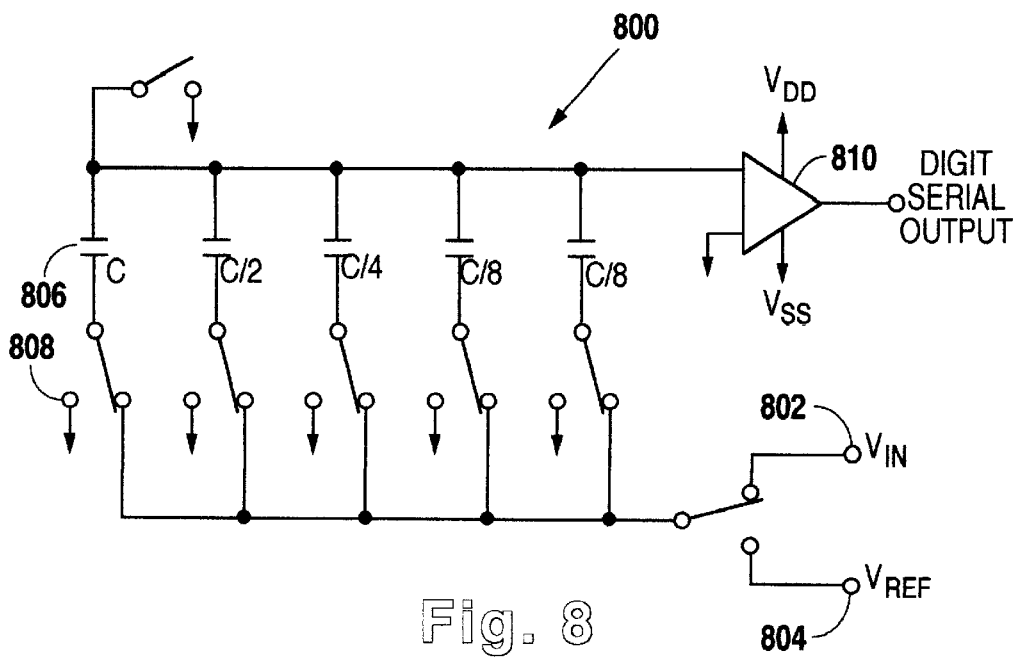
FIGS. 8 and 9 illustrate prior art switched weighted capacitor array ADCs.

As mentioned above, the signal processing circuitry coupled to the programmable gain preamplifier output may include a variety of types of circuits, including for example, ADC circuitry. In one example, the ADC may be a successive approximation ADC. One type of successive approximation ADC is a switched binary weighted capacitor ADC. Generally, in a switched binary weighted capacitor ADC an array of binary weighted capacitors and a comparator are provided. An analog input signal and a voltage reference are provided to the capacitor array. The capacitor array provides a successive approximation output which is coupled to an input of a comparator. The comparator compares the capacitor array output to another reference (for example ground) to produce a digital output. An exemplary prior art switched weighted capacitor ADC is shown in FIG. 8. As shown in FIG. 8, the ADC 800 may include an analog input 802, a reference input 804, an array of capacitors 806, an array of switches 808, and a comparator 810 which receives as inputs the capacitor array output and ground. In operation, the analog input voltage 802 is sampled and the various switches are successively opened and closed and the capacitor array output is compared to ground to create a digital number. The operation of a switched capacitor array is described in more detail in U.S. Pat. No. 4,129,863 to Gray et al., the disclosure of which is incorporated herein by reference.

Figure 9:
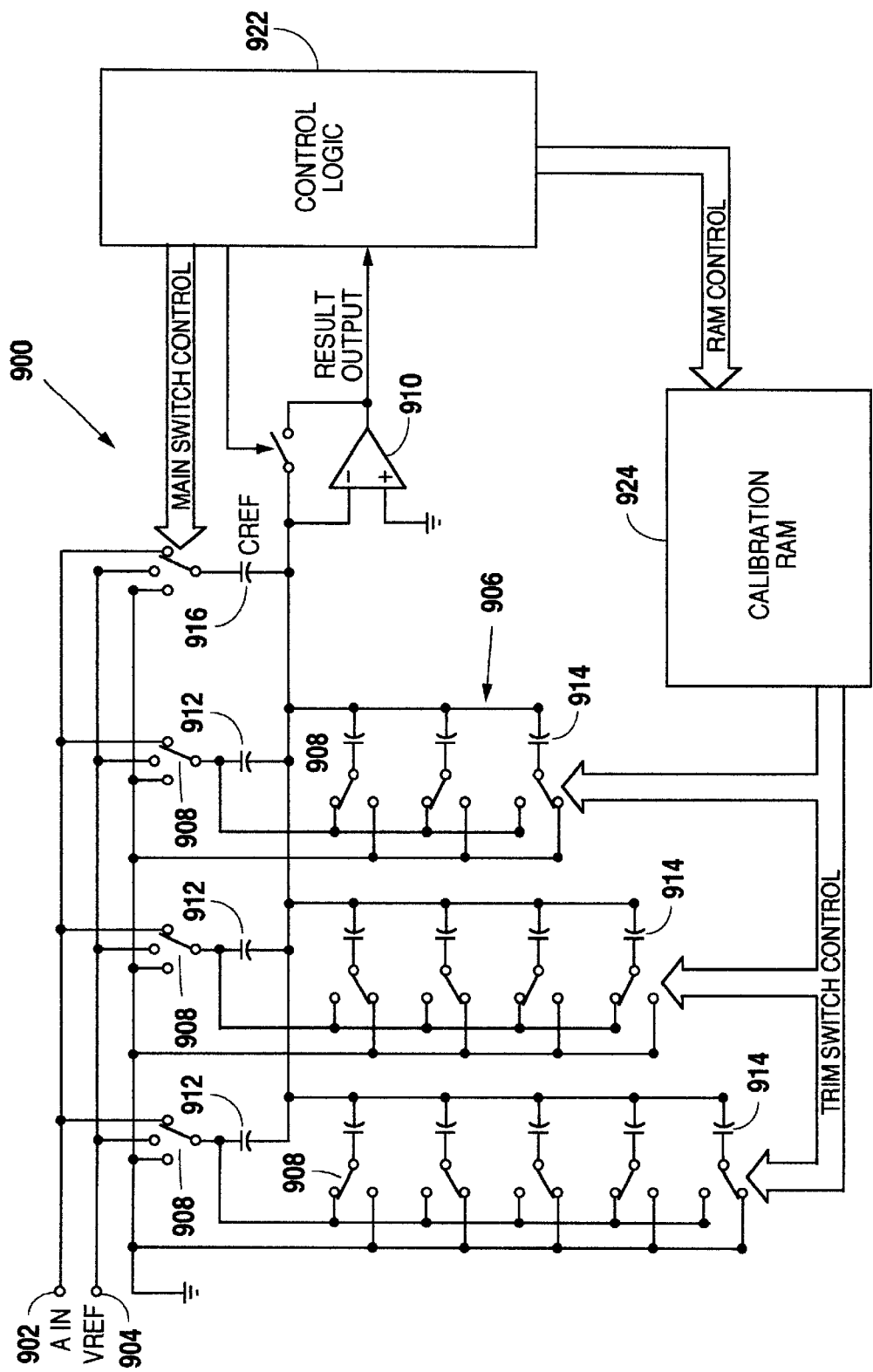

The accuracy of the switched capacitor array ADC 800 of FIG. 8 is affected by the accuracy of the capacitance values of the capacitor elements. The capacitor elements may exhibit errors as originally fabricated and may exhibit errors that change over time and temperature. Thus, it is desirable to calibrate the capacitor array at repeated intervals and it is desirable that the ADC circuitry be self-calibrating. An exemplary prior art self-calibrating ADC circuit is shown in FIG. 9. As shown in FIG. 9, the ADC 900 may include an analog input 902, a reference input 904, an array of capacitors 906, an array of switches 908, and a comparator 910. The array of capacitors 906 may include primary capacitors 912, trim capacitors 914 and a reference capacitor 916. In calibration, the capacitance of each primary capacitor may be repeatedly compared to the capacitance of the reference capacitor 916. The capacitance of the trim capacitors may be added or subtracted to the capacitance of the primary capacitor as a result of the comparison to the reference capacitor under control of control logic 922 and a calibration ROM 924. The self-calibration of a capacitor array is described in more detail in U.S. Pat. No. 4,709,225 to Welland et al. and in Lee et al., "A Self-Calibrating 15 Bit CMOS A/D Converter," IEEE JSSC, December, 1984, p. 813–819, the disclosures of which are incorporated herein by reference. In this manner, the capacitance values of a switched capacitor array may be repeatedly calibrated to provide a more accurate ADC.

Figure 10:
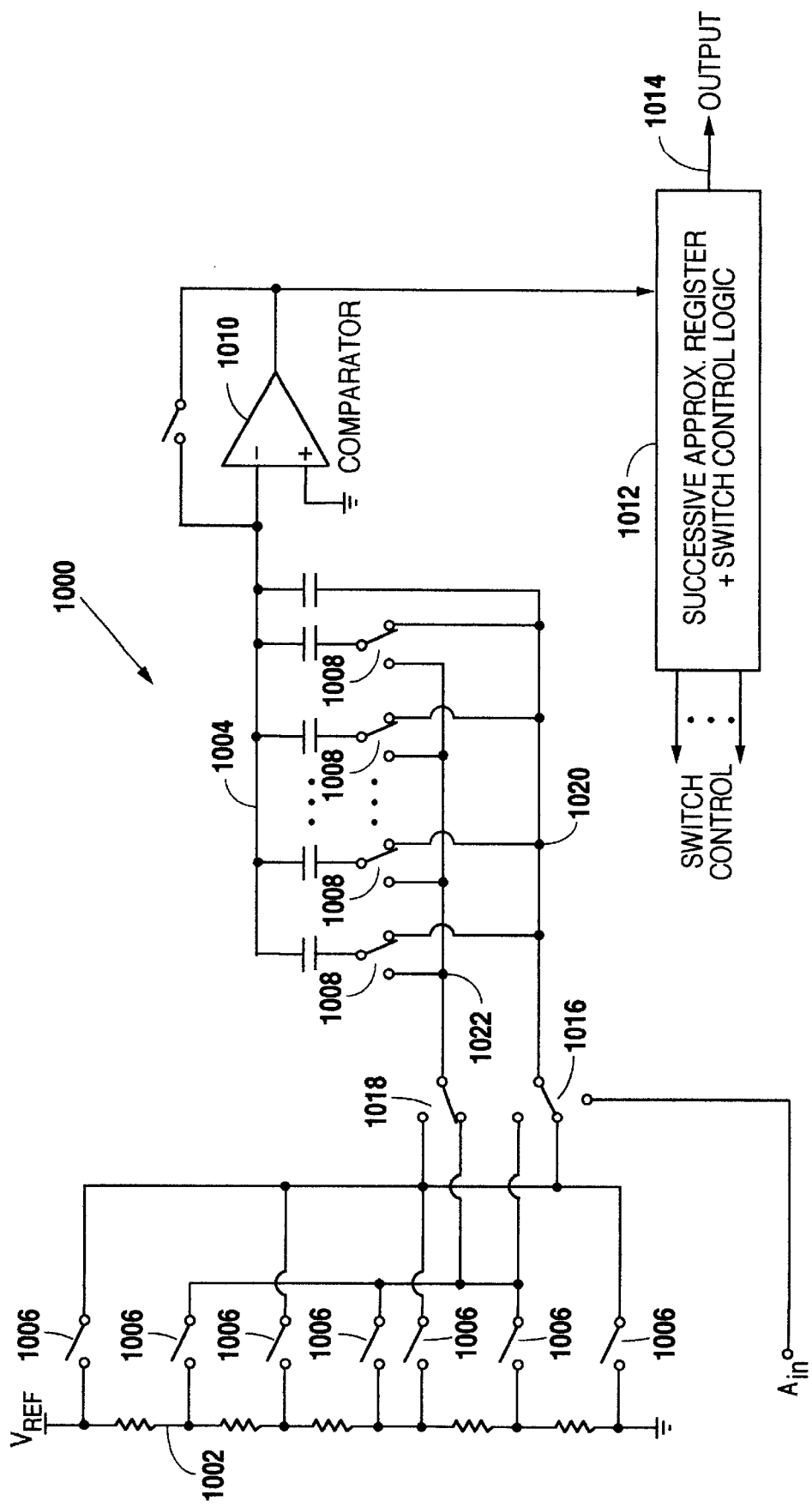
FIG. 10 illustrates a prior art switched resistor array and capacitor array ADC.

Another type of successive approximation ADC which may be utilized in the circuit of FIG. 2 in combination with the programmable gain preamplifier disclosed herein is a switched resistor and capacitor array ADC (an "R-C array ADC"). As shown in FIG. 10, a resistor and capacitor array ADC may include a resistor array such as the resistor string 1002 and a capacitor array 1004. A first set of switches 1006 and a second set of switches 1008 are provided between the two arrays. The resistor array may be used to obtain the MSBs and the capacitor array used to obtain the LSBs. An analog input Ain is also provided. A comparator 1010 provides a comparison output to a register and control logic block 1012 which provides a digital output 1014. In operation, the R-C array ADC 1000 is first configured to sample the Ain voltage by connecting switch 1016 to the Ain voltage and the capacitors to node 1020 so that the input voltage may be stored on the capacitor array. A successive approximation search may then be performed with the resistor array (resistor string 1002) to find the greatest resistor tap voltage not greater than the analog input voltage. This successive approximation search determines the MSBs of the digital output. The ends of the resistor segment defined by the previous step may then be coupled to nodes 1020 and 1022 through switches 1006, 1016 and 1018. The capacitor array may then be switched in a successive approximation sequence. The sequence of the comparator outputs corresponds to the digital code of the analog input. The operation of a R-C array ADC is described in more detail in Fotouhi, "High-Resolution Successive Approximation Analog To Digital Conversion Techniques In MOS Integrated Circuits" Dissertation, University of California, 1980, p. 86–93, the disclosure of which is incorporated herein by reference.

As mentioned above with reference to FIG. 2, the system 200 of FIG. 2 may process an analog input 202 (Ain) to provide a digital output 216. A digital domain predictor may determine a gain level G and an analog input estimation Ain'. The digitally programmable preamplifier 204 may produce an output related to G(Ain−Ain'). An ADC may then convert the preamplifier output to a digital output 216. The ADC's described herein are meant to be exemplary circuits, and the system 200 may utilize other ADCs.

The closer the estimated analog signal Ain' is to the actual analog input Ain the smaller the difference Ain−Ain' will be, and thus, the more gain G that may be applied without saturating (or overranging) the ADC. By providing more gain to the signal difference, the difference may be raised more above the ADC noise level. Thus, if the estimation Ain' of the Ain 202 signal is relatively accurate, subtracting the estimated signal will allow for increased gain in front of the ADC, and thus, result in an improved dynamic range at the ADC output.

One method to obtain an accurate estimate of the analog input Ain signal is to perform a first conversion (or estimation conversion) of the Ain input signal. Then, using the estimation conversion of the Ain input signal an estimation signal Ain' may be determined. The estimation signal Ain' may then be utilized to perform a second conversion (or main conversion) of the G(Ain−Ain') preamplifier output. More particularly, in one embodiment an estimation conversion of the analog input signal Ain may be performed with the preamplifier gain G=1 (i.e., the preamplifier may be bypassed). The ADC may then convert Ain to determine a digital output Dout. Based upon the Dout value, a digital domain predictor may then produce an Ain'estimation. The preamplifier may then be digitally programmed for the appropriate gain and estimation input voltage settings. The second or main conversion may then be performed utilizing the gain and estimation input voltage settings to provide a full resolution analog to digital conversion representing a conversion of G(Ain−Ain').

Figure 11A:
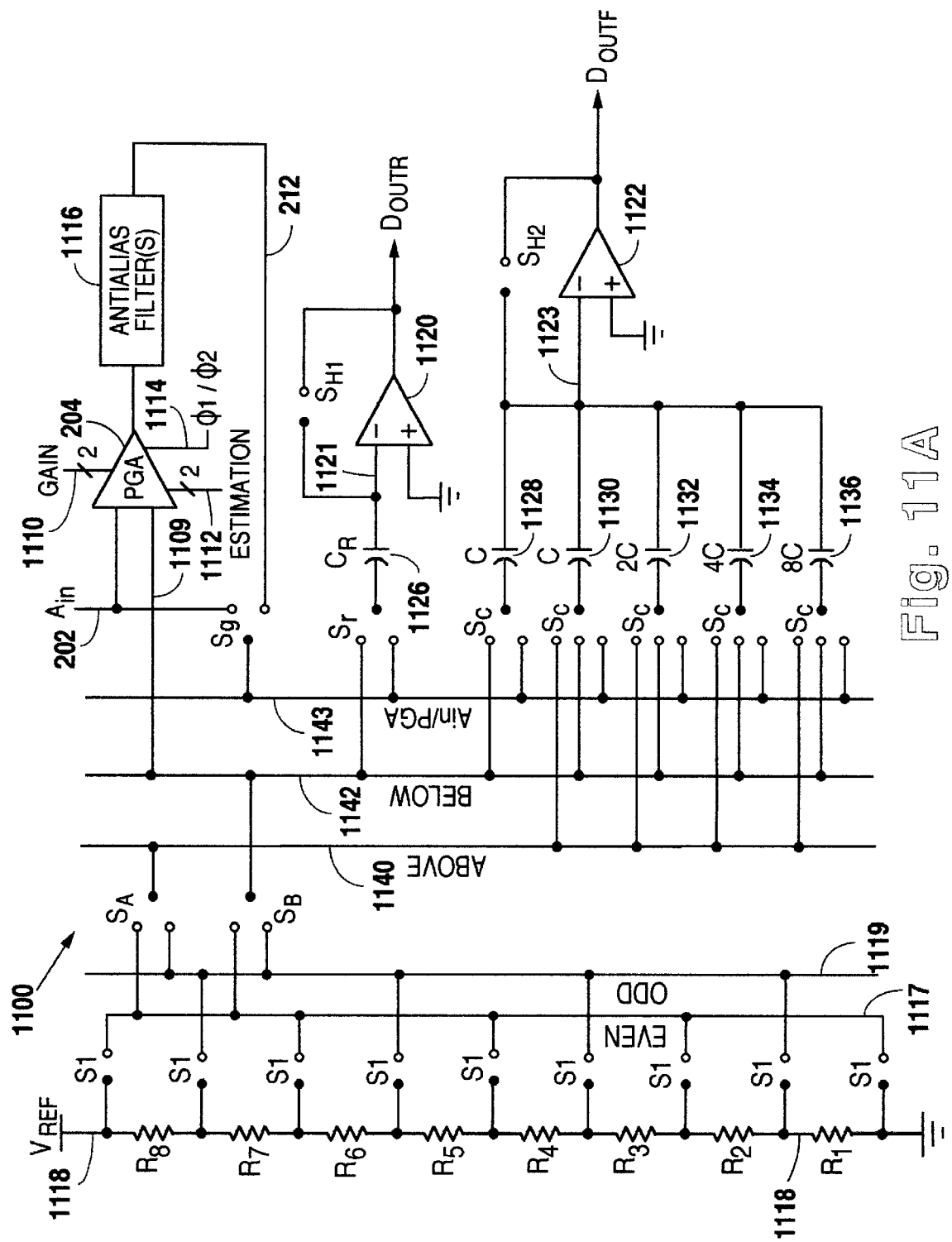
FIGS. 11A–11H illustrate the operation of a switched resistor array and capacitor array ADC for use with the present inventions.

As mentioned above, a variety of ADCs may be utilized to convert the G(Ain−Ain') term. One such ADC is an R-C array ADC which has a rough and fine comparators. FIG. 11A illustrates one exemplary R-C array ADC having rough and fine comparators. As shown in FIG. 11A, a programmable gain preamplifier block 204 and the R-C array ADC 1100 are provided. The programmable gain preamplifier 204 may be an amplifier configured as disclosed above. The programmable gain preamplifier 204 may receive digital inputs including gain signals 1110 and estimation signals 1112 (utilized to configure the preamplifier switches to the desired gain and estimation values as described above). The programmable gain preamplifier 204 may also receive a two phase chopper signal 1114. An antialias filter 1116 receives the programmable gain preamplifier output. The techniques disclosed herein do not require an antialias filter between the preamplifier and the ADC, and alternatively, the filter may be considered to be functionally a part of either the preamplifier block or the ADC block.

The R-C array ADC 1100 includes a resistor array and a capacitor array. The resistor array may include the resistor string 1118. As discussed in more detail below, the resistor string 1118 may be a stand alone resistor string dedicated to the ADC 1100, or alternatively, may be a resistor string that is shared with the programmable gain preamplifier 204. Thus, for example, resistor string 1118 and resistor string 314 of the programmable gain preamplifier 204 may be the same resistor string. Though the resistor string may be shared, the discussion of the operation of the ADC herein will be with reference to figures such as FIG. 11A which shows the resistor string outside of the programmable gain preamplifier for clarity and understanding of the ADC functionality. The capacitor array may include capacitors 1126, 1128, 1130, 1132, 1134 and 1136. Capacitor 1126 may be a sampling capacitor having a capacitance Cr. Capacitors 1128–1136 may be binary weighted capacitors having capacitances of C, C, 2C, 4C, and 8C respectively as shown in the figure. A rough comparator 1120 has an inverting input 1121 provided from the rough sampling capacitor 1126 and provides a rough digital output Doutr. A fine comparator 1122 has an inverting input 1123 connected to the capacitors 1128–1136 and provides a fine digital output Doutf. For ease of illustration, the R-C array shown in FIG. 11A is a three bit resistor array and a two bit capacitor array. In one embodiment, the resistor string may be a six bit resistor string and the capacitor array may be a 10 bit capacitor array.

Switch Sg selectively provides either the analog input Ain 202 or an amplified output 212 as an input to the ADC 1100. Thus, both the programmable gain preamplifier 204 and the ADC 1100 may receive the analog input signal Ain 202. If no gain of the analog input signal Ain 202 is desired (i.e., gain G=1), the switch Sg may connect the Ain 202 signal to the Ain/PGA line 1143. If a gained input signal is desired to be provided to the ADC, the switch Sg may be configured to connect the amplified output 212 to the Ain/PGA line 1143.

The switches S1 are provided between the resistor string 1118 and two voltage bus lines 1117 and 1119. Switches S1 may be the same switches S1 as shown in FIGS. 3A–3F and 4A–4B. Switches Sa and Sb may selectively apply the voltage on lines 1117 and/or 1119 to an above voltage line 1140 and a below voltage line 1142. Switch Sr selectively connects the rough sampling capacitor 1126 to either the Ain/PGA line 1143 or the below line 1142. Switches Sc selectively connect the capacitors 1128–1136 to either the Ain/PGA line 1143, the below line 1142, and/or the above line 1140 as shown. Switches Sh1 and Sh2 provide feedback around the comparators 1120 and 1122 respectively. Switches Sh1 and Sh2 may be closed when a voltage is being sampled onto the capacitor array or the rough sampling capacitor.

The operation of the R-C array ADC 1100 will be described with reference to FIGS. 11B–11G and with reference to an input to the ADC provided from the amplifier PGA output 212 (switch Sg configured to provide the output 212 to the Ain/PGA line 1143). It will be recognized that the ADC operation described may also apply to the configuration which samples the Ain 202 input such as shown in FIG. 11H.

In operation, the R-C array ADC 1100 is first configured to sample the ADC input voltage provided on the Ain/PGA line 1143. After the acquisition of the input signal, the resistor string array is utilized to determine the MSBs using the rough comparator 1120. After the MSBs are determined with the resistor string and the rough comparator, a retest of the MSBs is performed with the fine comparator 1122 to confirm the MSB determination of the rough comparator. The retest cycle allows the MSBs to be reconfirmed or modified by the result of a comparator that has not experienced the large overdrives that the rough comparator may experience. After the retest, the even line 1117 and odd line 1119 may be coupled above and below the resistor that corresponds to the MSB voltage. The above and below voltages may then be utilized when the capacitor array is switched in a successive approximation sequence to determine the LSBs. The sequence of comparator outputs corresponds to the digital codes.

Figure 11B:
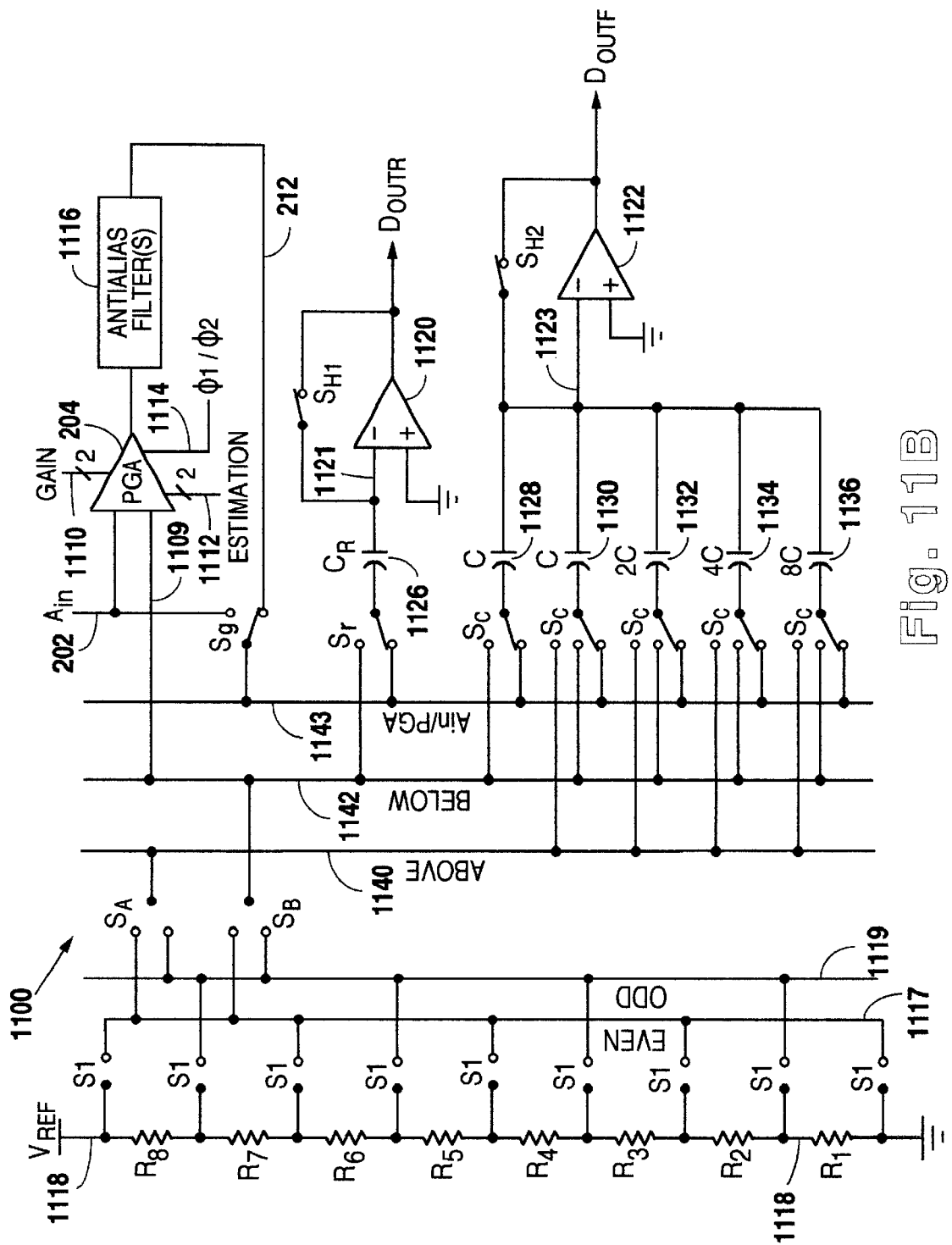
Figure 11C:
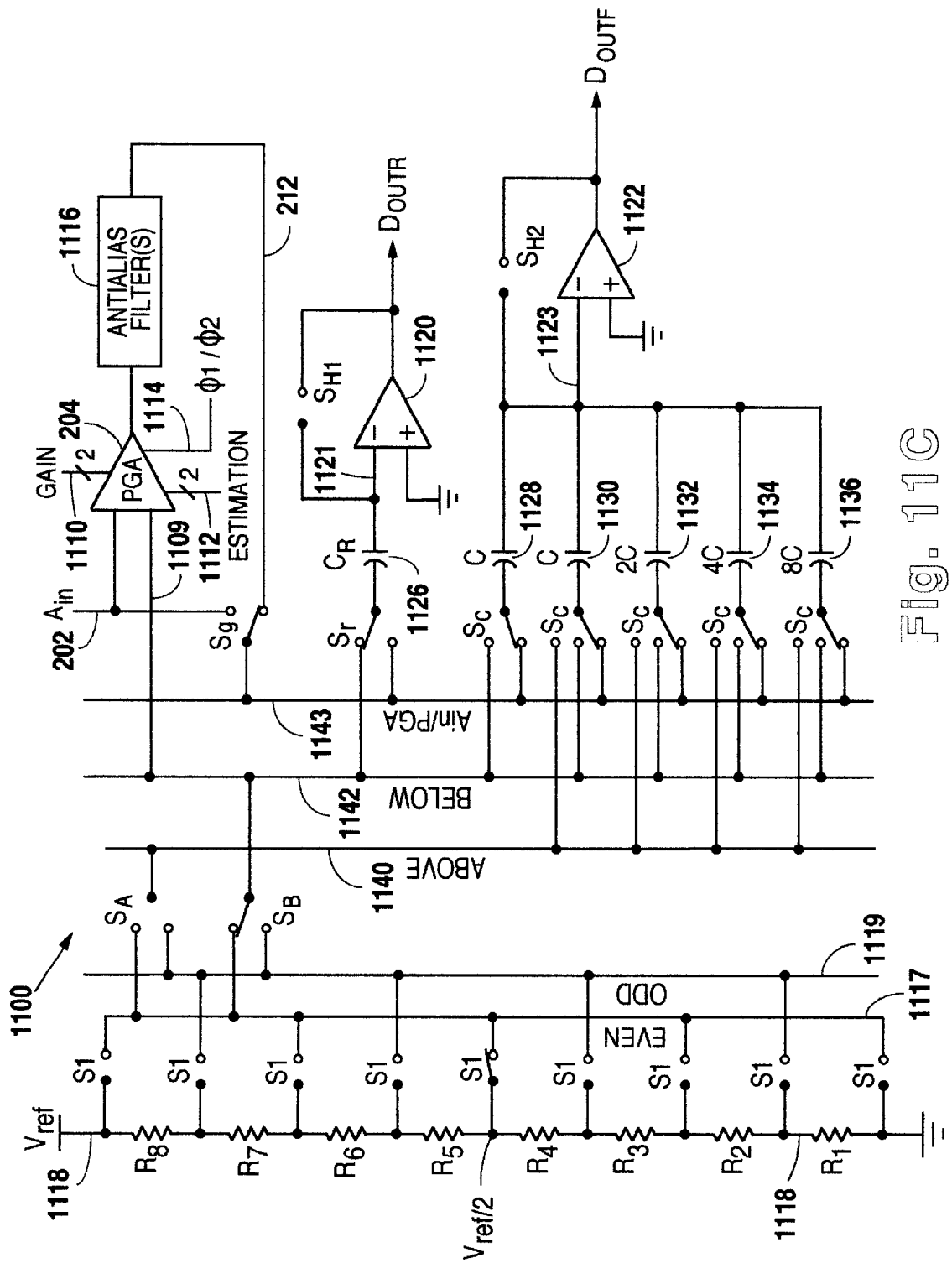
Figure 11D:
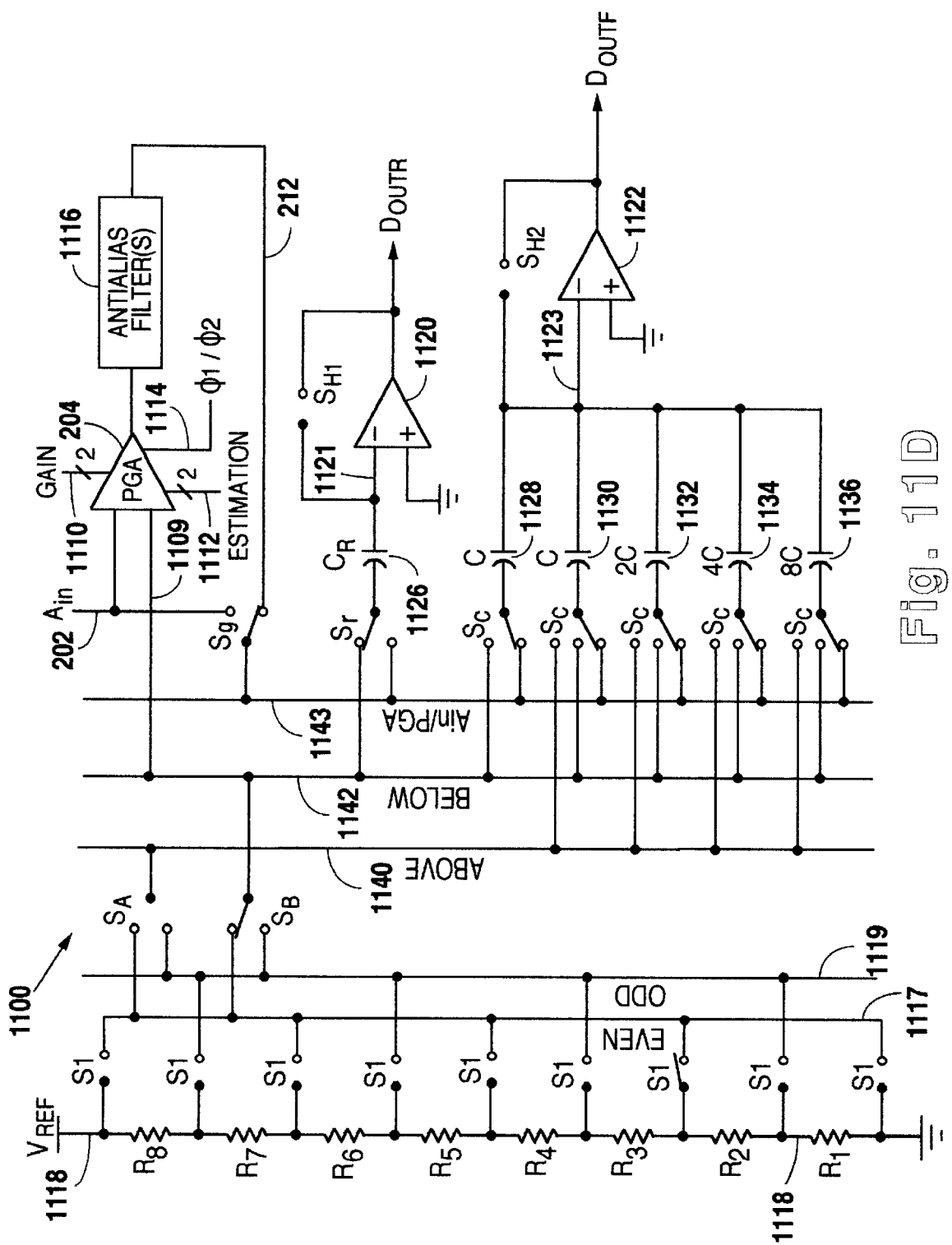
Figure 11E:
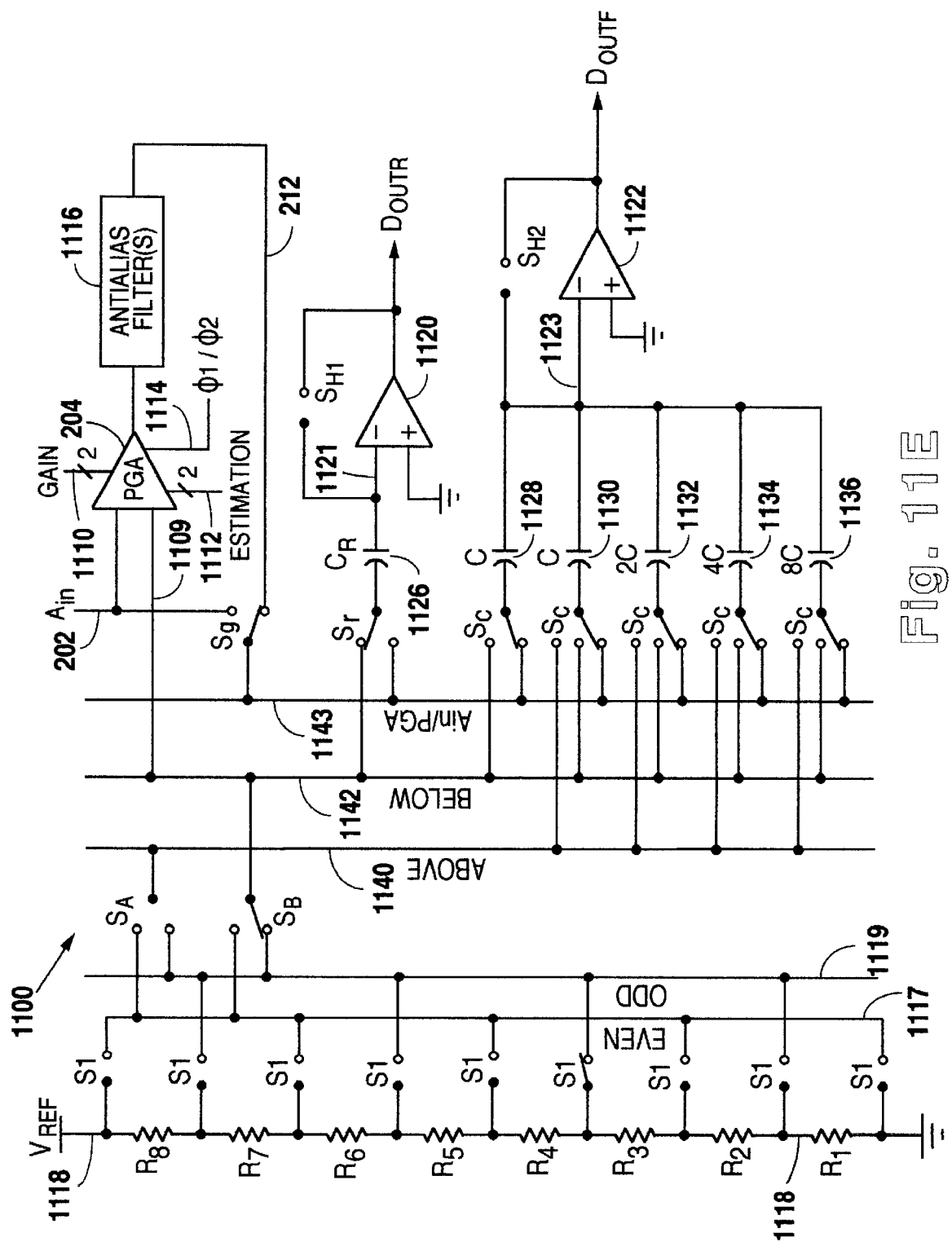

The operations described above are shown in an illustrative example in FIGS. 11B–11G. FIGS. 11B–11G illustrate a conversion in which the analog voltage to be converted lies at a voltage level between the top and bottom of the resistor R2 of the resistor string 1118 (an MSB code of 001 corresponding to a voltage below Vref/4 and above Vref/8). In order to demonstrate the retest concept, it will also be assumed that the ADC erroneously selects the MSB code 010 (i.e., a voltage corresponding to between the resistor R3 top and bottom taps). As shown in FIG. 11B, the amplified output 212 of the preamplifier is provided as the ADC input and is acquired onto the rough sampling capacitor 1126 and the fine capacitor array 1128–1136. Switches Sh1 and Sh2 open to sample the input and the ADC is configured to test the MSB with the rough comparator 1120 as shown in FIG. 11C. As shown in FIG. 11C, the MSB test is provided by testing the Vref/2 voltage of the resistor string 1118 and applying that voltage to the rough comparator 1120 through switches Sb and Sr. Since Vref/2 is above the voltage on the Ain/PGA line 1143, the inverting input of the rough comparator 1120 goes positive and the rough comparator output Doutr=0. The MSB-1 test is shown in FIG. 11D. The rough comparator output for such a test with the given input should be Doutr=0. As mentioned above, for demonstrative purposes it will be assumed that the rough comparator output is erroneously Doutr=1 (due to comparator memory or other errors). The configuration for the MSB-2 bit (the last of the MSBs determined with the resistor array) is shown in FIG. 11E and yields a rough comparator output of Doutr=0.

Figure 11F:
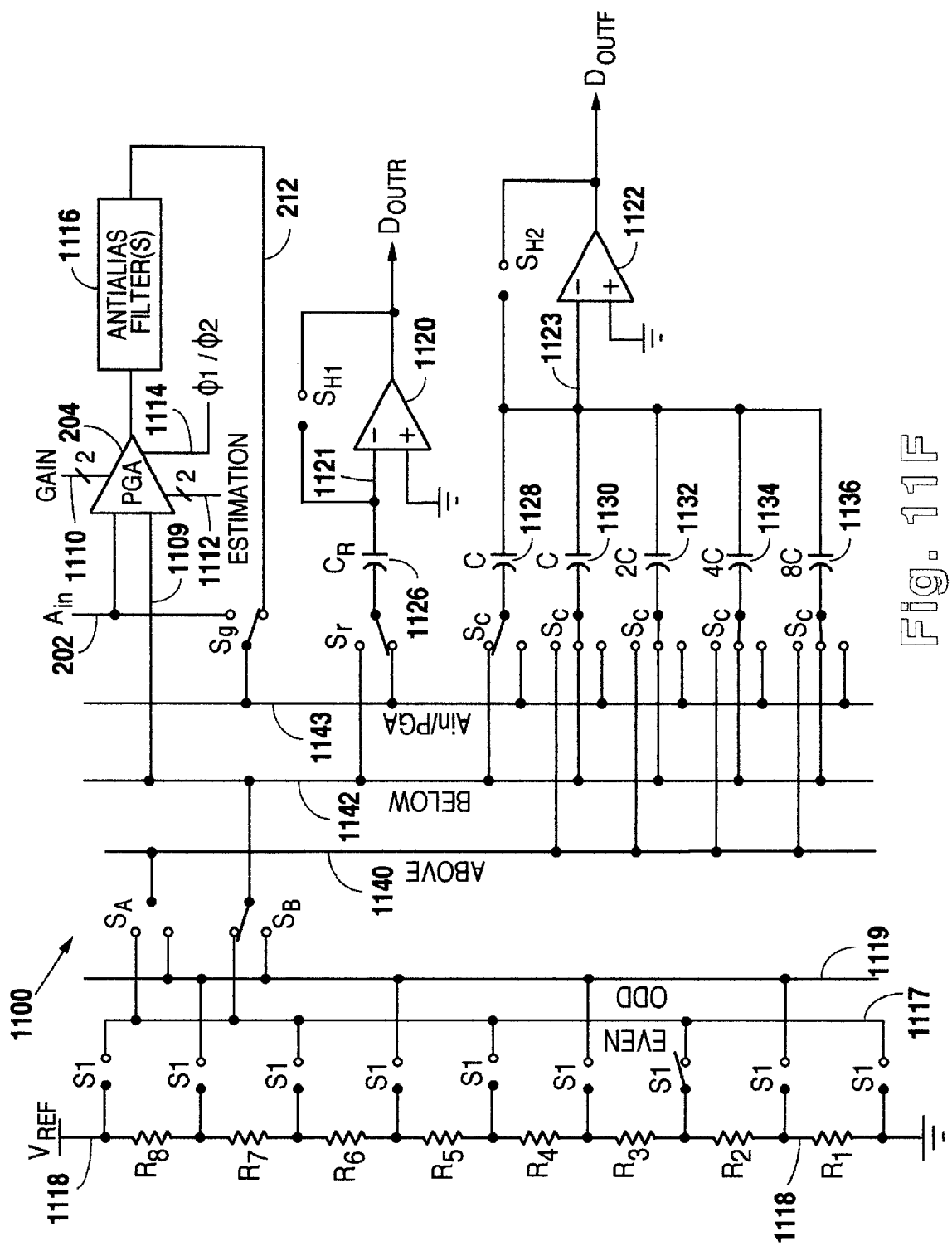

The retest configuration which tests the MSBs determined with the rough comparator 1120 is shown in FIG. 11F. As shown in FIG. 11F, only the fine comparator 1122 is utilized in the retest and during the retest (and all subsequent LSB tests) the rough comparator is returned to tracking the Ain/PGA line 1143. During the retest cycle, the voltage level that is determined to be just below the analog input being converted as determined with the rough comparator cycle is tested. As shown in FIG. 11F, the retest voltage is the voltage just below resistor R3 (corresponding to the voltage just below the erroneous 010 determination). The selected voltage of the resistor string is then applied through switches Sb and Sc to the capacitors 1128–1136 as shown. The output of the fine comparator 1122 will then be Doutf=0, indicating a mistake in the rough comparator operation. In the case of an error determination, the determined value of the MSBs may then be decremented to provide a retest value of the MSBs.

Figure 11G:
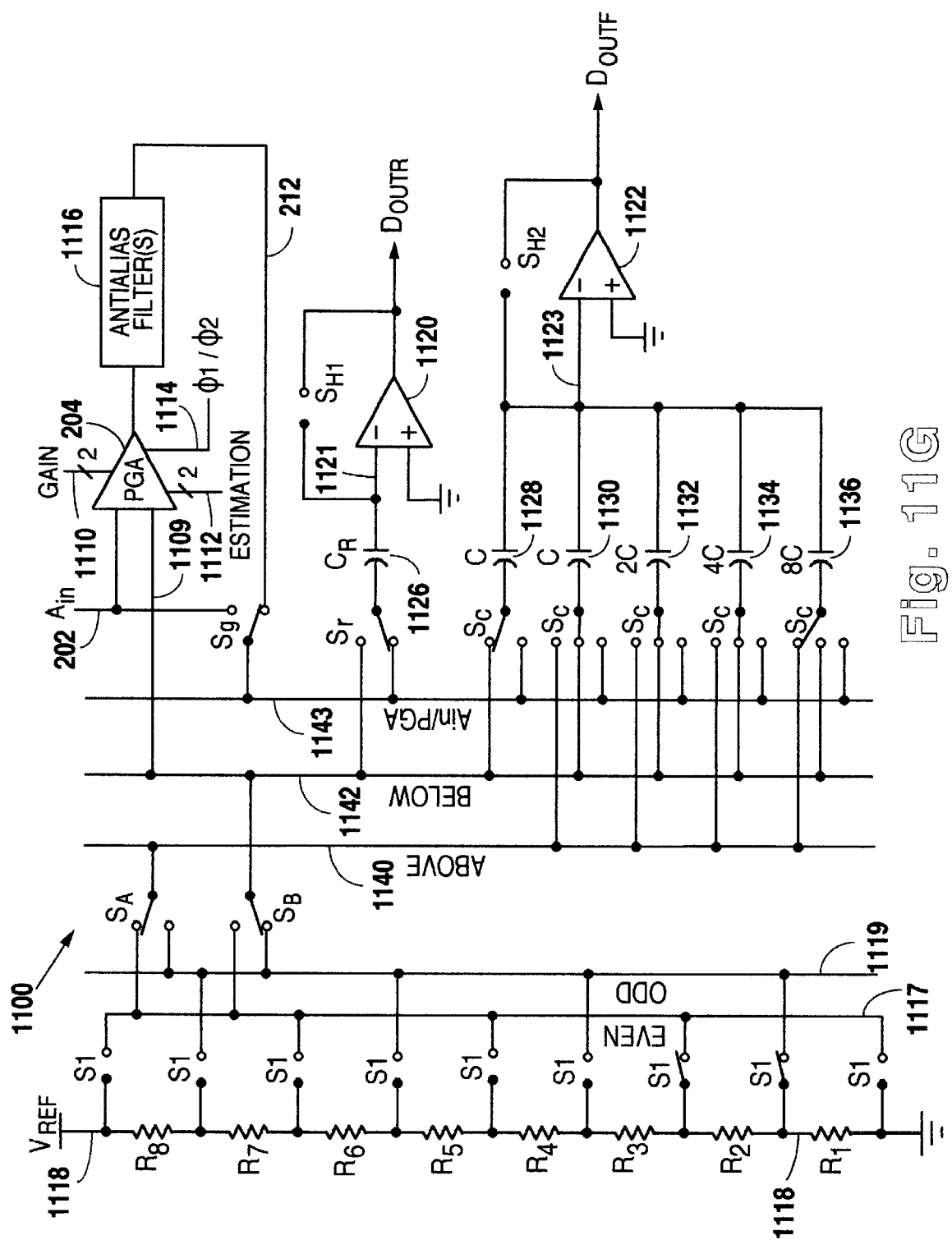
Figure 11H:
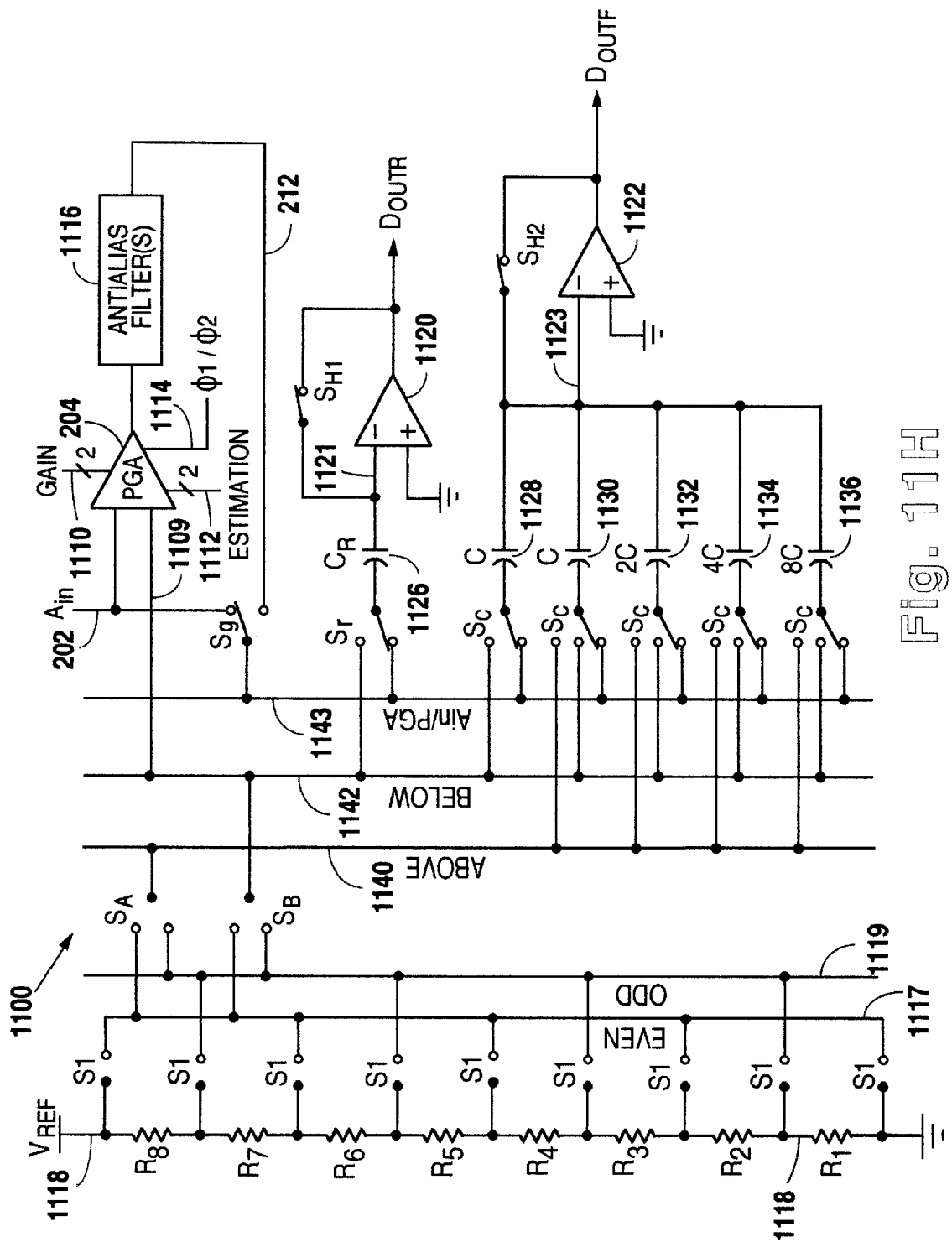

The voltages from the resistor string above and below the MSBs as determined by the retest may then be coupled to the capacitor array coupled to the fine comparator. As shown in FIG. 11G, the voltages above and below the resistor R2 may be provided to the above line 1140 and below line 1142 respectively through switches Sa and Sb. The LSBs may then be determined successively by successively switching the capacitors 1128–1136 with the configuration of FIG. 11G until the LSB is determined.

FIG. 11H shows the R-C array ADC 1100 coupled to the Ain 202 analog signal in order to sample the analog input without any gain. When it is desirable to convert the analog input with any gain, the remaining steps for operation of the ADC when an amplified input is provided will remain the same as described above with respect for a conversion of the Ain 202 input (except with the switch Sg coupled to the amplified output line 212). When the Ain 202 signal is being sampled directly (bypassing the preamplifier so gain G=1) for the purpose of determining an estimated signal Ain', the ADC operation may be modified. In particular, the estimated signal Ain' may be provided merely to determine the proper selection of a tap in the preamplifier resistor string 314 (a six bit resolution resistor string in the examples herein). Thus, the full sixteen bit accuracy of the ADC 1100 is not needed and only the six MSBs may be needed to determine which tap to select for the Ain' estimate. The conversion using the ADC 1100 may therefore be halted when the six MSBs (i.e., the number of MSBs corresponding to the resolution of the resistor string 314 of the preamplifier) are determined. It will be recognized that if the resistor string 314 which provides Ain' has a resolution higher than six bits then additional MSBs should be determined by the ADC 1100. When chopper stabilization techniques are utilized in the preamplifier, the ADC may be operated so that a full conversion is performed for each of the two chop phases and the ADC output digital words for each phase may be averaged to produce the final ADC output.

It will further be noted that the use of a rough and fine comparator is not limited to an R-C array ADC, but rather, may also be utilized with a capacitor array ADC such as discussed above with reference to FIGS. 8 and 9. In such a system using a capacitor array, a resistor string may be coupled to the preamplifier input (such as resistor string 314 of FIGS. 3A and 4A), a capacitor array may be utilized in the ADC circuitry, and the ADC circuitry may include both rough and fine comparators. An exemplary capacitor array ADC using rough and fine comparators is shown in U.S. Pat. No. 5,006,853 to Kiriaki, the disclosure of which is incorporated herein by reference.

As mentioned above, the resistor string 1118 of the R-C array ADC 1100 may be implemented as the same resistor string as resistor string 314 of the programmable gain preamplifier 204. Thus, the programmable gain preamplifier and the ADC may have a shared resistor string. In operation, the switches S1 and Sb may be configured to couple the resistor string 1118 to the programmable gain preamplifier input 1109 prior to the sampling of the amplified output 212 shown in FIG. 1H. A protection network may be built into the programmable gain preamplifier 212 so that after sampling occurs and as conversion process proceeds, the input 1109 of the preamplifier will not swing as the resistor string 1118 tap switches are changed.

The resistors utilized with the ADC (whether shared or not) may be implemented in a polysilicon layer or in a laser trimmable layer such as a ni-chrome layer. In either case, the contacts to the resistor string may be removed from the resistor string current path according to the techniques discussed above. In a polysilicon embodiment, the temperature coefficients of the resistor ratios may provide a sufficient accuracy (if calibrated as described below) such that over a temperature range of 25° C. to 125° C. the ADC integral nonlinearity (INL) error may be in the range of a few ppm of the ADC full scale. Though the temperature drift of the resistors of the resistor strings disclosed herein (for example resistor strings 314, 316 and 1118) may be low, the actual resistor values may not be highly accurate. These inaccuracies will provide errors in the gain, estimation input, and/or the ADC INL error. Thus, it is desirable to calibrate the resistor strings. One calibration method is to utilize a highly linear ADC to calibrate the resistor strings. The ADC may be, for example, a metal-metal capacitor delta sigma modulated ADC, such as shown for example in U.S. Pat. No. 4,943,807 to Early et al., the disclosure of which is incorporated herein by reference. Metal-metal capacitors provide improved linearity and the large parasitic capacitance associated with such capacitors negated since the calibration delta sigma ADC is relatively slow and insensitive to parasitics. The delta sigma modulator may be autozeroed or chopped to provide improved long-term stability, offset and 1/f noise, and the modulator's digital filter may be designed to reject interference coupled into the delta sigma ADC at ac line frequencies and their harmonics.

Figure 12:
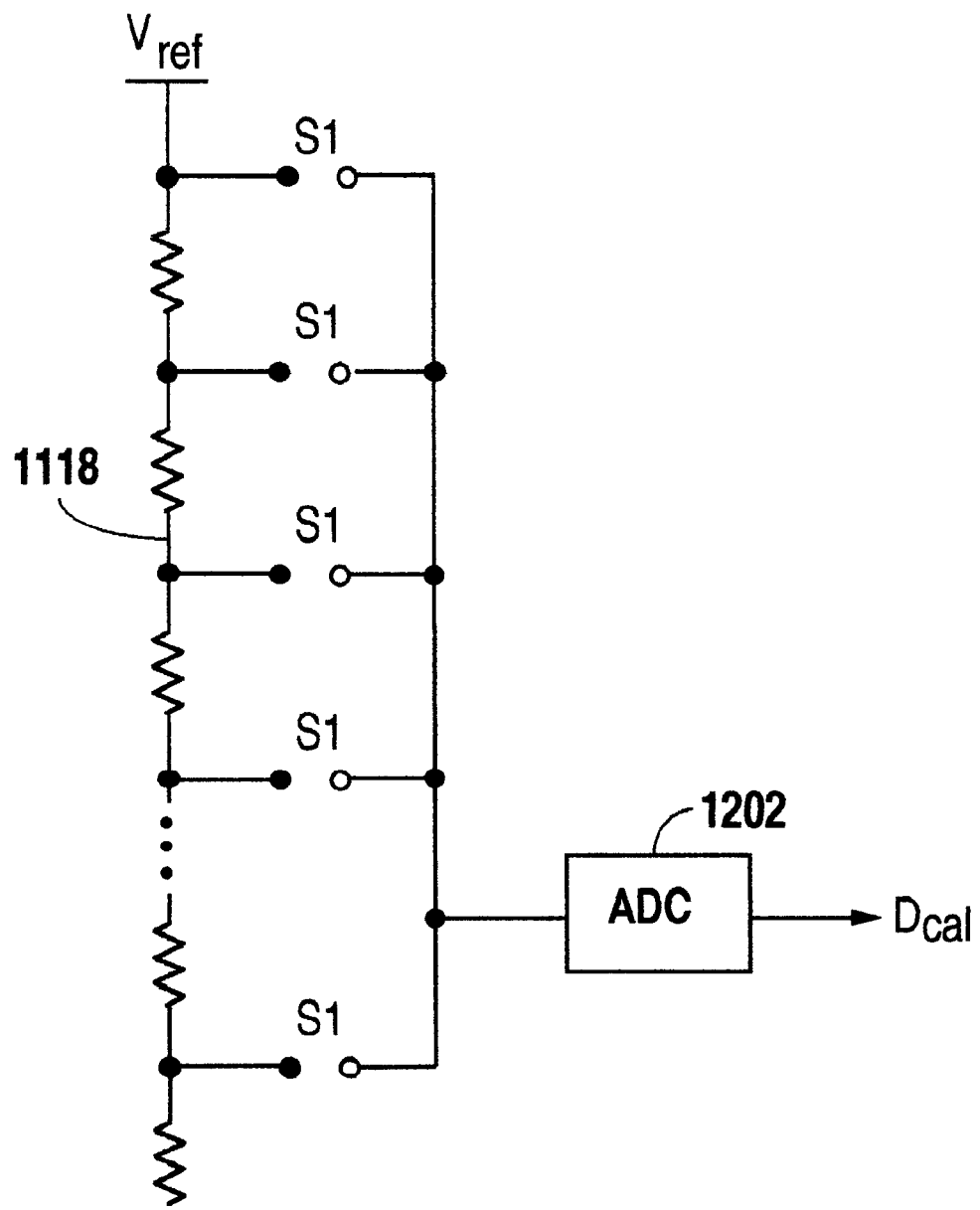
FIG. 12 illustrates a method for using a calibration ADC to calibrate a resistor string.

In one embodiment, a six bit resistor string may be accurately calibrated utilizing a 20 bit ADC. The calibration concept may be seen with reference to FIG. 12. As shown FIG. 12, the exemplary resistor string being calibrated is the resistor string 1118. The highly linear calibration ADC 1202 may sample the tap voltages at each tap of the resistor string by selectively closing one of the switches S1 to provide a digital output value Dcal corresponding to the tap voltage. The results of the calibration need not be utilized to change the actual values of the resistors of the resistor string, rather the output results of the overall system may be digitally post corrected by the knowing the calibration data. For example, if the actual voltages of the resistor strings 314 and the resistor ratios of the resistor string 316 of the programmable gain amplifier are known, then a post correction of the system output when the input signal is amplified may be accomplished since the effect of the resistor inaccuracies on the G(Ain−Ain') function may be determined. Likewise, knowing the inaccuracies of the resistor string 1118 will allow for a post conversion correction of the ADC output. In the case when the resistor strings 314 and 1118 are shared, a single calibration will therefore calibrate the resistors of the preamplifier input and the ADC resistor array. The same calibration ADC 1202 may be utilized to calibrate the each resistor string 314, 316, and/or 1118. Though the resistor string 316 may be directly calibrated by the calibration ADC 1202, the resistor ratios of the resistor string 316 may alternatively be inferred. In particular, the resistor ratios of resistor string 316 may be inferred by calibrating each tap of the resistor string 314 and measuring the OPAMP3 output when a known input is provided to the Ain 202 input (the known input may be another of the taps of the resistor string 314). Thus, a single highly accurate calibration ADC may be utilized to calibrate all of the resistor strings of the system. The gain and offset of the calibration ADC itself may be measured immediately prior to calibrating a resistor string or immediately prior to measuring the voltage of each tap of the resistor string. By using a highly linear ADC 1202 (for example a metal-metal capacitor delta sigma ADC), the ADC 1202 may be the linearity reference of the system. The ADC 1202 may compensate for both initial component errors and aging of components over time.

Though shown as a separate ADC, the ADC 1202 may be the same ADC that is used for converting the analog input signal Ain to a digital output. For example, the resistor string 314 may be calibrated with the ADC 1100 of the figures or if a capacitor array ADC is utilized for Ain data conversions, the capacitor array ADC may be utilized to calibrate the resistor string. However, using a switched R-C array ADC or a switched capacitor array ADC in place of a separate calibration ADC 1202 may result in a lower calibration performance since the switched array ADCs may have less linearity.

The resistor string may also be calibrated by providing accurately known inputs to the Ain 202 input of the ADC 1100 and coupling those inputs to the Ain/PGA line 1143 (no gain applied). The accurately known inputs may then be converted by the ADC 1100. The ADC outputs created may then be compared to ADC outputs generated when applying voltages from the resistor string 1118 to the Ain/PGA line 1143. A comparison of the ADC outputs when using the resistor string and the ADC outputs when using the accurately known voltages may then be used to create a calibration table for the resistor string that indicates the resistor value errors. This technique may also be utilized to calibrate a preamplifier resistor string such as resistor string 314. Moreover, this technique is not limited to R-C array ADCs, but rather a capacitor array ADC may be used in this manner to help calibrate a resistor string in other circuitry (such as the resistor string 314 of the preamplifier). The calibration table may then be used to post conversion correct for errors in a resistor string whether that resistor string is in a preamplifier, the ADC or both. Utilizing accurate known input voltages, may however, require periodic user recalibrations.

As mentioned above, the calibration data generated by calibrating the resistor strings may be utilized to post conversion correct the output data of the ADC 1100. Such post corrections, though may result in mapping uncorrected ADC data and corrected ADC data in a manner that generates missing digital output codes. For example, a sixteen bit ADC 1100 having a six bit resistor array and a ten bit capacitor array will segment each voltage of the resistor string into 1024 segments. A table of exemplary mapping for some resistor inaccuracies in the resistor string 1118 is shown below. The example below illustrates potential errors that may occur if two adjacent resistors Rz and Rz+1 (the resistors being near midscale) have +5% and −5% errors in their resistance.

|  | $V_{in}/V_{ref}$ | Uncorrected ADC data | Corrected data |
|---|---|---|---|
|  | 0.531250 | 34816 | 34816 |
| Rz< |  | >1024 | >1075 |
|  | 0.514844 | 33792 | 33741 |
| Rz + 1< |  | >1024 | >973 |
|  | 0.500000 | 32768 | 32768 |

In the table, ADC exemplary data for voltages in two resistor ranges, Rz and Rz+1 are shown. For inputs in the Rz range, 1024 uncorrected ADC data output values map into 973 corrected data output values. Thus no digital codes are missing in this range as at least one uncorrected value exists for each corrected value. However, in the Rz+1 range 1024 uncorrected ADC data output values map into 1075 corrected data output values leaving 51 missing codes from the corrected ADC output. The potential for missing codes may be lessened by adding one extra bit of resolution to the capacitor array (i.e. an extra capacitor). With the example ten bit capacitor resolution, an extra capacitor may therefore be utilized, however, the uncorrected data may still be mapped to 10 bit resolution (the number of digital codes per resistor segment=1024±resistor errors). This should assure that no missing codes in the corrected ADC data.

The techniques described herein simulate the use of a highly accurate and highly stable resistor string. Though the resistor strings utilized herein may not be inherently highly accurate (for example a six bit string which has resistor value errors of ±5%), the resistor string may be calibrated to a high level of accuracy (for example twenty bit accuracy). Moreover, utilizing techniques which place the resistor string contacts out of the current path provides highly stable resistor strings having very little drift. Using the calibration data for system level corrections at the output provides a system output accuracy that simulates the use of a much higher accuracy resistor string.

Because a highly stable and highly accurate resistor string may be achieved by utilizing the concepts described herein (locating contacts out the resistor string current path and calibrating the resistor string), the calibrated resistor string may be utilized to calibrate the ADC 1100 or another type of ADC used as the main ADC in place of the ADC 1100, such as for example, a capacitor array ADC. In such circumstances, the voltages at the various resistor string taps may be applied as an input to the ADC. Knowing the calibration factors for the resistor string, and thus the actual voltages at each tap, the ADC output codes may be analyzed for each voltage of the resistor string. From these output codes a calibration table may be created for the ADC itself.

The offset of the rough and fine comparators 1120 and 1122 may change as a result of overdrives the comparator experiences. This "memory" effect may result in DNL errors even if an additional capacitor is added to the capacitor array. The memory effect may be lessened by using comparators having p-channel transistor input devices rather than n-channel input devices.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A circuit configured to be incorporated with an analog to digital conversion system, the circuit comprising:
   a resistor string included within the analog to digital conversion system;
   a first analog to digital converter utilized to produce uncorrected digital output values; and
   a calibration analog to digital converter within the analog to digital conversion system, the calibration analog to digital converter coupled to the resistor string to produce digital correction values,
   wherein the analog to digital conversion system utilizes the uncorrected digital output values and the digital correction values to produce the conversion system digital output.

2. The circuit of claim 1, the calibration analog to digital converter being a delta sigma converter.

3. The circuit of claim 1, the resistor string coupled to a capacitor array of the analog to digital conversion system.

4. The circuit of claim 1, wherein the resistor string has substantially all resistor string contacts located out of a current path of the resistor string.

5. The circuit of claim 1, wherein the analog to digital conversion system is a switched resistor and capacitor array analog to digital conversion system, the resistor string being at least a portion of the resistor array.

6. The circuit of claim 1, the resistor string providing calibration voltages to the analog to digital conversion system.

7. The circuit of claim 1, the resistor string having substantially all resistor string contacts placed out of the resistor string current path.

8. The circuit of claim 1, wherein the resistor string is utilized at least in part within a programmable gain preamplifier within the analog to digital conversion system.

9. A method of operating an analog to digital conversion system to convert an analog signal to a digital signal, comprising:

providing a resistor string within the conversion system; and calibrating the resistor string with a first analog to digital converter by correcting digital signal output values to compensate for inaccuracies within the resistor string.

10. The method of claim 9, further comprising utilizing the resistor string to calibrate the first analog to digital converter or a second analog to digital converter.

11. The method of claim 10, the second analog to digital converter converting the analog signal to uncorrected digital output values.

12. The method of claim 11, the second analog to digital converter comprising a switched capacitor array.

13. The method of claim 11, the first analog to digital converter being a delta sigma analog to digital converter.

14. The circuit of claim 11, wherein the resistor string is utilized when providing an analog input to the second analog to digital converter.

15. The circuit of claim 14, wherein the resistor string is utilize at least in part within a programmable gain preamplifier within the analog to digital conversion system.

16. The method of claim 9, further comprising utilizing the resistor string when performing conversions which convert the analog signal to the digital signal.

17. The method of claim 9, further comprising converting the analog signal to the digital signal with a switched resistor and capacitor array analog to digital converter.

18. The method of claim 9, the resistor string having substantially all resistor string contacts placed out of the resistor string current path.

19. An analog to digital conversion system including an analog to digital converter, the system comprising:

at least one switched capacitor array; and at least one resistor string electrically coupled to the at least one switched capacitor array; the at least one resistor string having substantially all resistor string contacts located out of a current path of the resistor string, wherein digital correction values compensate the system digital output for inaccuracies in the at least one resistor string.

20. The system of claim 19, wherein the analog to digital converter utilizes the resistor string when performing conversions.

21. The system of claim 19, wherein the analog to digital converter utilizes at least one switched capacitor array when performing conversions.

22. The system of claim 19, further comprising a calibration analog to digital converter coupled to the at least one resistor string.

23. The system of claim 22, wherein the calibration analog to digital converter is a delta sigma converter.

24. The system of claim 19, the analog to digital converter further comprising a rough comparator and a fine comparator.

25. A method of configuring a circuit for converter an analog input to a digital output, comprising:

providing an analog to digital converter comprising a capacitor array; and placing substantially all contacts of at least one resistor string out of the current path of the resistor string, the resistor string providing highly stable voltages, wherein digital correction values compensate the digital output for inaccuracies in the at least one resistor string.

26. The method of claim 25, further comprising calibrating the resistor string.

27. The method of claim 25, wherein digital correction values are derived from the output of a calibration analog to digital converter.

28. The method of claim 27, wherein the calibration analog to digital converter is a delta sigma converter.

29. The method of claim 25, an output of the analog to digital converter being an average of at least two conversion results of the analog to digital converter.

30. The method of claim 25, the analog to digital converter being a switched resistor and capacitor array analog to digital converter.

31. A method of configuring a circuit for converting an analog input to a digital output, comprising:

providing a first analog to digital converter, the first analog to digital converter having at least a switched capacitor array;

generating calibration voltages for the first analog to digital converter using a resistor string, substantially all contacts of the at least one resistor string being out of a current path of the resistor string; and coupling a calibration analog to digital converter to the resistor string.

32. The method of claim 3, wherein the resistor string is utilized to calibrate the first analog to digital converter.

33. The method of claim 3, wherein the first analog to digital converter utilizes the resistor string when performing conversions.

34. The method of claim 3, wherein the first analog to digital converter is a switched capacitor array analog to digital converter.

35. The method of claim 3, wherein the fist analog to digital converter is a switched resistor and capacitor array analog to digital converter.

36. The method of claim 31, further comprising calibrating the resistor string.

37. The method of claim 3, wherein the calibration analog to digital converter is a delta sigma converter.

38. A conversion circuit for converting analog signals to digital signals, comprising:

a first analog to digital converter, the first analog to digital converter converting an analog signal to an uncorrected digital output; and a second analog to digital converter, the second analog to digital converter utilized by the conversion circuit to calibrate the first analog to digital converter, a resolution of first analog to digital converter exceeding a resolution of an output of the conversion circuit to allow digital domain post conversion correction.

39. The conversion circuit of claim 38, uncorrected output data of the first analog to digital converter being mapped to an output of the conversion circuit.

40. The conversion circuit of claim 38, wherein the second analog to digital converter is a delta sigma analog to digital converter.

41. The conversion circuit of claim 38, the resolution of the second analog to digital converter exceeding the resolution of the first analog to digital converter.

42. The conversion circuit of claim 38, further comprising a resistor string calibrated by the second analog to digital converter.

43. The conversion circuit of claim 42, wherein substantially all resistor string contacts of the resistor string are located out of the resistor string current path.

44. A method of converting an analog signal to a digital signal, comprising:

converting the analog signal to a set of uncorrected digital output values with a first analog to digital converter; and utilizing a calibration analog to digital converter to allow mapping of the set of uncorrected digital output values to a set of corrected digital output values, wherein a size of the set of uncorrected digital output values exceeds a size of the set of corrected digital output values.

45. The method of claim 44, wherein the mapping does not produce missing output codes.

46. The method of claim 44, wherein the calibration analog to digital converter has a higher bit accuracy than the first analog to digital converter.

47. The method of claim 46, the second analog to digital converter being a delta sigma converter.

48. The method of claim 44, the first analog to digital converter comprising a resistor string, the calibration analog to digital converter calibrating the resistor string.

49. The method of claim 48, the resistor string having substantially all resistor string contacts located out of the resistor string current path.

50. The method of claim 44, the calibrating further comprising calibrating a resistor string using the calibration analog to digital converter and calibrating the first analog to digital converter with the resistor string.

51. The method of claim 50, the resistor string having substantially all resistor string contacts located out of the resistor string current path.

52. The method of claim 44, further comprising storing calibration data processed from the output of the calibration analog to digital converter in a calibration table and utilizing the calibration data to digitally perform the mapping.

* * * * *

UNITED STATES PATENT AND TRADEMARK OFFICE
CERTIFICATE OF CORRECTION

PATENT NO.    : 6,452,519 B1                                                Page 1 of 1
DATED         : September 17, 2002
INVENTOR(S)   : Eric J. Swanson It is certified that error appears in the above-identified patent and that said Letters Patent is hereby corrected as shown below:

<u>Title page,</u>
Item [73], please delete "Assignee: Silicon Laboratories, Inc. (Austin, TX)".

Signed and Sealed this

Seventh Day of January, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,452,519 B1  
DATED        : September 17, 2002  
INVENTOR(S)  : Eric J. Swanson It is certified that error appears in the above-identified patent and that said Letters Patent is hereby corrected as shown below:

Column 23,  
Line 36, please change "utilize" to -- utilized --.

Column 24,  
Line 6, please change "converter" to -- converting --.  
Lines 39, 41, 44, 47 and 52, please change "3" to -- 31 --.

Signed and Sealed this

Twentieth Day of May, 2003

JAMES E. ROGAN  
*Director of the United States Patent and Trademark Office*